(12) United States Patent
Luo et al.

(10) Patent No.: US 12,004,320 B2
(45) Date of Patent: Jun. 4, 2024

(54) THERMAL COMPONENT AND ELECTRONIC DEVICE

(71) Applicant: Huawei Technologies Co., Ltd., Shenzhen (CN)

(72) Inventors: Yang Luo, Wuhan (CN); Qi Chen, Wuhan (CN); Haitao Zhen, Wuhan (CN); Zhiguo Zhang, Wuhan (CN); Chao Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 143 days.

(21) Appl. No.: 17/596,612

(22) PCT Filed: Jun. 17, 2020

(86) PCT No.: PCT/CN2020/096575
§ 371 (c)(1),
(2) Date: Dec. 14, 2021

(87) PCT Pub. No.: WO2020/253723
PCT Pub. Date: Dec. 24, 2020

(65) Prior Publication Data
US 2022/0304189 A1  Sep. 22, 2022

(30) Foreign Application Priority Data

Jun. 18, 2019 (CN) .......................... 201910526651.7

(51) Int. Cl.
*H05K 7/20* (2006.01)

(52) U.S. Cl.
CPC ..... *H05K 7/20172* (2013.01); *H05K 7/20336* (2013.01)

(58) Field of Classification Search
CPC .................. H05K 7/20172; H05K 7/20336
See application file for complete search history.

(56) References Cited

U.S. PATENT DOCUMENTS

| 5,646,822 A * | 7/1997 | Bhatia | F28D 15/02 361/679.52 |
|---|---|---|---|
| 7,288,895 B2 * | 10/2007 | Rossi | H01J 61/52 315/112 |
| 8,701,747 B2 * | 4/2014 | Senyk | G06F 1/203 361/689 |
| 10,551,881 B2 * | 2/2020 | Ho | G06F 1/206 |

(Continued)

FOREIGN PATENT DOCUMENTS

| CN | 1487387 A | 4/2004 |
|---|---|---|
| CN | 2620782 Y | 6/2004 |

(Continued)

*Primary Examiner* — Michael A Matey
(74) *Attorney, Agent, or Firm* — Slater Matsil, LLP

(57) ABSTRACT

A thermal system includes a system component, a working medium, a second-level thermal component, and a working medium transmission component. The system component includes a first-level thermal component and a working medium driver. The working medium driver is configured to drive the working medium to flow through a primary flow-through structure, a secondary flow-through structure, and a transmission channel in the working medium transmission component, and the thickness of the working medium driver is less than or equal to 5 mm.

20 Claims, 25 Drawing Sheets

(56) References Cited

U.S. PATENT DOCUMENTS

| | | | | |
|---|---|---|---|---|
| 2002/0001176 A1* | 1/2002 | Shibasaki | G06F 1/203 | 361/679.52 |
| 2002/0051339 A1* | 5/2002 | Ohashi | G06F 1/203 | 361/679.46 |
| 2002/0075643 A1* | 6/2002 | Nakagawa | G06F 1/1616 | 361/679.52 |
| 2003/0214786 A1* | 11/2003 | Niwatsukino | H01L 23/473 | 257/E23.098 |
| 2004/0008489 A1* | 1/2004 | Minamitani | G06F 1/203 | 361/699 |
| 2004/0042174 A1* | 3/2004 | Tomioka | G06F 1/203 | 361/679.53 |
| 2004/0042176 A1* | 3/2004 | Niwatsukino | F28D 15/0266 | 165/80.4 |
| 2004/0042184 A1* | 3/2004 | Tomioka | G06F 1/203 | 361/752 |
| 2004/0070940 A1* | 4/2004 | Tomioka | G06F 1/203 | 361/679.48 |
| 2004/0070942 A1* | 4/2004 | Tomioka | G06F 1/203 | 174/15.2 |
| 2004/0114324 A1* | 6/2004 | Kusaka | G06F 1/203 | 361/699 |
| 2004/0188069 A1* | 9/2004 | Tomioka | G06F 1/206 | 257/E23.098 |
| 2005/0069432 A1* | 3/2005 | Tomioka | H01L 23/473 | 257/E23.098 |
| 2005/0117298 A1* | 6/2005 | Koga | G06F 1/203 | 257/E23.098 |
| 2005/0174714 A1* | 8/2005 | Ishikawa | G06F 1/203 | 361/103 |
| 2005/0180109 A1* | 8/2005 | Miyazaki | G06F 1/203 | 361/700 |
| 2006/0171113 A1* | 8/2006 | Wu | G06F 1/203 | 361/679.26 |
| 2006/0209512 A1* | 9/2006 | Taniguchi | G06F 1/203 | 165/80.4 |
| 2007/0070599 A1* | 3/2007 | Chang | G06F 1/203 | 361/679.52 |
| 2008/0130221 A1* | 6/2008 | Varadarajan | G06F 1/203 | 361/679.52 |
| 2009/0035121 A1* | 2/2009 | Watson | F01C 1/126 | 73/861.87 |
| 2009/0279258 A1* | 11/2009 | Moore | G06F 1/203 | 16/221 |
| 2015/0110642 A1* | 4/2015 | Dahouk | F04D 29/5806 | 417/16 |
| 2016/0234968 A1 | 8/2016 | Huang | | |
| 2018/0329464 A1 | 11/2018 | Lin | | |
| 2020/0313521 A1* | 10/2020 | Coonrod | H02K 11/20 | |

FOREIGN PATENT DOCUMENTS

| | | |
|---|---|---|
| CN | 1605971 A | 4/2005 |
| CN | 1637292 A | 7/2005 |
| CN | 1653405 A | 8/2005 |
| CN | 1738521 A | 2/2006 |
| CN | 1244853 C | 3/2006 |
| CN | 1299356 C | 2/2007 |
| CN | 100346261 C | 10/2007 |
| CN | 101636068 A | 1/2010 |
| CN | 1581366 B | 5/2010 |
| CN | 101923375 A | 12/2010 |
| CN | 102072168 A | 5/2011 |
| CN | 105159421 A | 12/2015 |
| CN | 205139822 U | 4/2016 |
| CN | 205669619 U | 11/2016 |
| CN | 106445024 A | 2/2017 |
| CN | 106933314 A | 7/2017 |
| CN | 107039370 A | 8/2017 |
| CN | 107608407 A | 1/2018 |
| CN | 107643815 A | 1/2018 |
| CN | 107726904 A | 2/2018 |
| CN | 108334179 A | 7/2018 |
| CN | 108882615 A | 11/2018 |
| CN | 109599375 A | 4/2019 |
| CN | 110418549 A | 11/2019 |
| JP | 2002014747 A | 1/2002 |

* cited by examiner

O2-O2

THERMAL COMPONENT AND ELECTRONIC DEVICE

CROSS-REFERENCE TO RELATED APPLICATIONS

This application is a national stage of International Application No. PCT/CN2020/096575, filed on Jun. 17, 2020, which claims priority to Chinese Patent Application No. 201910526651.7, filed on Jun. 18, 2019. Both of the aforementioned applications are hereby incorporated by reference in their entireties.

TECHNICAL FIELD

This application relates to the field of heat dissipation technologies used for electronic devices, and in particular, to a thermal component and an electronic device.

BACKGROUND

With the progress of science and technology, current electronic devices are developing in directions of a multifunction, a high speed, and a small size. Integration of some chips such as system on chips (system on chips, SOCs) in the electronic device is increasingly high, and a calculation amount in a data processing process is increasingly large. As a result, working heat generated by a processor on a unit area is greatly increased, and the processor becomes a high heat emitting element. The working heat from the high heat emitting element affects performance and life of the processor and other components in the electronic device.

SUMMARY

Embodiments of this application provide a thermal component and an electronic device, to dissipate heat for a high heat emitting element in the electronic device.

To achieve the foregoing objective, the following technical solutions are used in the embodiments of this application.

According to a first aspect of the embodiments of this application, a thermal system is provided. The thermal system includes a system component. The system component includes a first-level thermal component and a working medium driver. The thermal system further includes a working medium, a second-level thermal component, and a working medium transmission component. The first-level thermal component includes a primary thermal plate to be in contact with a heat emitting element, and a primary flow-through structure that is disposed in the primary thermal plate and through which the working medium flows. The second-level thermal component includes a secondary thermal plate, and a secondary flow-through structure that is disposed in the secondary thermal plate and through which the working medium flows. The working medium transmission component is rotatably connected to the secondary thermal plate and the system component. A transmission channel in the working medium transmission component is used to communicate at least the primary flow-through structure and the secondary flow-through structure. The working medium driver is configured to drive the working medium to flow through the primary flow-through structure, the secondary flow-through structure, and the transmission channel in the working medium transmission component.

In this way, the working medium driver can drive the working medium to be transmitted from the working medium driver to the primary flow-through structure in the primary thermal plate. The primary thermal plate is in contact with the heat emitting element. Therefore, when flowing through the primary thermal plate, the working medium can absorb heat of the heat emitting element, so that the heat emitting element can be cooled down, thereby dissipating heat for the heat emitting element. Then, driven by the working medium driver, the working medium that absorbs the heat of the heat emitting element flows into the secondary flow-through structure in the secondary thermal plate through the transmission channel in the working medium transmission component. The secondary thermal plate is connected to a housing of the electronic device. Therefore, a part of heat in the working medium can be absorbed by using the housing, so that temperature of the working medium can be reduced, thereby dissipating heat for the heat emitting element.

Optionally, the working medium transmission component includes at least one first working medium transmission portion. The first working medium transmission portion is rotatably connected to the primary thermal plate and the secondary thermal plate. A transmission channel in the first working medium transmission portion communicates with the primary flow-through structure and the secondary flow-through structure. In this way, on a basis that the primary thermal plate can be rotatably connected to the secondary thermal plate by using the first working medium transmission portion, the primary flow-through structure on the primary thermal plate can communicate with the secondary flow-through structure on the secondary thermal plate, so that the working medium in the primary flow-through structure can flow to the secondary flow-through structure through the transmission channel in the first working medium transmission portion. In addition, the working medium in the secondary flow-through structure can also flow to the primary flow-through structure through the transmission channel in the first working medium transmission portion.

Optionally, the first working medium transmission portion includes a primary connection pipe and a secondary connection pipe. The primary connection pipe is connected to the primary thermal plate, and an inner hole of the primary connection pipe communicates with the primary flow-through structure. The secondary connection pipe is rotatably connected to the primary connection pipe. The secondary connection pipe is connected to the secondary thermal plate, and an inner hole of the secondary connection pipe communicates with the secondary flow-through structure. In this way, with the primary connection pipe and the secondary connection pipe, the primary flow-through structure on the primary thermal plate can communicate with the secondary flow-through structure on the secondary thermal plate, and the primary thermal plate can be rotatably connected to the secondary thermal plate.

Optionally, the first working medium transmission portion further includes a hose. The hose passes through the inner holes of the primary connection pipe and the secondary connection pipe. One end of the hose communicates with the primary flow-through structure, and the other end communicates with the secondary flow-through structure. An inner hole of the hose serves as the transmission channel in the first working medium transmission portion. Therefore, the working medium can flow through the inner hole of the hose, so that the working medium can be transmitted in the first working medium transmission portion.

Optionally, the first working medium transmission portion further includes a lyophobic coating covering an outer surface of the hose. The lyophobic coating can be used to reduce a probability that polymer leakage occurs in the working medium in the hose when the working medium passes through the hose.

Optionally, the first working medium transmission portion further includes a rotary connection pipe and at least one sealing component. One end of the primary connection pipe is butted with one end of the secondary connection pipe, and the two ends are both nested in the rotary connection pipe. The sealing component is located between a hole wall of an inner hole of the rotary connection pipe and an outer wall of the primary connection pipe, or the sealing component is located between a hole wall of an inner hole of the rotary connection pipe and an outer wall of the secondary connection pipe. In this way, a probability that liquid leakage occurs in the first working medium transmission portion can be reduced by disposing the sealing component.

Optionally, the first working medium transmission portion further includes at least one sealing component. A part of the primary connection pipe extends into the inner hole of the secondary connection pipe. The sealing component is located between an outer wall of the primary connection pipe and a hole wall of the inner hole of the secondary connection pipe. Alternatively, a part of the secondary connection pipe extends into the inner hole of the primary connection pipe. The sealing component is located between an outer wall of the secondary connection pipe and a hole wall of the inner hole of the primary connection pipe. In this way, a part of the primary connection pipe extends into the inner hole of the secondary connection pipe, or a part of the secondary connection pipe extends into the inner hole of the primary connection pipe, so that the primary connection pipe can be rotatably connected to the secondary connection pipe. In addition, a probability that liquid leakage occurs in the first working medium transmission portion can be reduced by disposing the sealing component.

Optionally, the working medium transmission component further includes a second working medium transmission portion. The second working medium transmission portion is rotatably connected to the secondary thermal plate and the working medium driver. A liquid outlet of the working medium driver communicates with the primary flow-through structure, and a transmission channel in the second working medium transmission portion communicates with the secondary flow-through structure and a liquid inlet of the working medium driver. In this way, driven by the working medium driver, the working medium can flow from the liquid outlet of the working medium driver to the primary flow-through structure to dissipate heat for the heat emitting element, and then the working medium is transmitted from the first working medium transmission portion to the secondary flow-through structure to perform heat dissipation on the primary thermal plate. Then, the working medium is transmitted to the second working medium transmission portion by using the secondary flow-through structure, and then flows back to the liquid inlet of the working medium driver after passing through the second working medium transmission portion, so that the working medium can perform next cyclic heat dissipation on the heat emitting element.

Optionally, the working medium transmission component further includes two first working medium transmission portions that are disposed side by side: a right first working medium transmission portion and a left first working medium transmission portion. The primary flow-through structure includes a first primary channel and a second primary channel. A liquid outlet of the working medium driver communicates with the first primary channel, and a liquid inlet of the working medium driver communicates with the second primary channel. A transmission channel in the right first working medium transmission portion communicates with the first primary channel and the secondary flow-through structure. A transmission channel in the left first working medium transmission portion communicates with the secondary flow-through structure and the second primary channel. In this way, the working medium driver can drive the working medium to be transmitted from the liquid outlet of the working medium driver to the first primary channel in the primary thermal plate. The primary thermal plate is in contact with the heat emitting element on a main board. Therefore, when flowing through the primary thermal plate, the working medium can absorb heat of the heat emitting element, so that the heat emitting element can be cooled down, thereby dissipating heat for the heat emitting element. Then, driven by the working medium driver, the working medium that absorbs the heat of the heat emitting element flows into the secondary flow-through structure in the secondary thermal plate through the transmission channel in the right first working medium transmission portion. The secondary thermal plate is connected to a first housing. Therefore, a part of heat in the working medium can be absorbed by using the first housing, so that temperature of the working medium can be reduced. Then, driven by the working medium driver, the working medium that is cooled down may flow from the secondary flow-through structure in the secondary thermal plate to the transmission channel in the left first working medium transmission portion, flow to the second primary channel in the primary thermal plate after passing through the left first working medium transmission portion, and then enter the liquid inlet of the working medium driver through the second primary channel. Therefore, after being driven by the working medium driver, the working medium enters the first primary channel in the primary thermal plate again from the liquid outlet of the working medium driver, to perform a next heat dissipation process.

Optionally, the working medium transmission component includes a first connection pipe and a second connection pipe. The second connection pipe is nested in an inner hole of the first connection pipe. The first connection pipe is rotatably connected to the primary thermal plate and the secondary thermal plate. The inner hole of the first connection pipe communicates with a liquid inlet of the working medium driver and the secondary flow-through structure, and a liquid outlet of the working medium driver communicates with the primary flow-through structure. An inner hole of the second connection pipe communicates with the primary flow-through structure and the secondary flow-through structure. In this way, the second connection pipe is nested in the first connection pipe, so that the working medium that flows from the liquid outlet of the working medium driver to the primary flow-through structure can flow to the secondary flow-through structure through the second connection pipe, and then flow back from the secondary flow-through structure to the liquid inlet of the working medium driver through the first connection pipe.

Optionally, at least a part that is in each of the first connection pipe and the second connection pipe and that is located between the primary thermal plate and the secondary thermal plate is made of a flexible material. Therefore, when the first connection pipe is connected to the primary thermal plate and the secondary thermal plate, the primary thermal plate and the secondary thermal plate can rotate by using the first connection pipe.

The primary flow-through structure includes a first primary channel and a second primary channel. A liquid outlet of the working medium driver communicates with the first primary channel, and a liquid inlet of the working medium driver communicates with the second primary channel. The working medium transmission component includes a third connection pipe and a fourth connection pipe. The fourth connection pipe is nested in an inner hole of the third connection pipe. The third connection pipe is rotatably connected to the primary thermal plate and the secondary thermal plate, and the inner hole of the third connection pipe communicates with the second primary channel and the secondary flow-through structure. An inner hole of the fourth connection pipe communicates with the first primary channel and the secondary flow-through structure. In this way, the fourth connection pipe is nested in the third connection pipe, so that the working medium that flows from the liquid outlet of the working medium driver to the first primary channel can flow to the secondary flow-through structure through the third connection pipe, then flow from the secondary flow-through structure to the second primary channel through the fourth connection pipe, and then flow back to the liquid inlet of the working medium driver through the second primary channel. In addition, when the liquid outlet of the working medium driver communicates with the second primary channel, and the liquid inlet communicates with the first primary channel, a flow-through process of the working medium is the same as that described above, and details are not described herein again.

Optionally, at least a part that is in each of the third connection pipe and the fourth connection pipe and that is located between the primary thermal plate and the secondary thermal plate is made of a flexible material. A manner of disposing the third connection pipe and the fourth connection pipe is the same as that of the first connection pipe and the second connection pipe, and details are not described herein again.

Optionally, the working medium driver includes a first upper cover, a first lower bottom, a partition plate, a stator, and a rotor. The first lower bottom is connected to the first upper cover to form an accommodation cavity. The partition plate is located in the accommodation cavity and connected to the first lower bottom. A sealing sub-cavity is formed between the partition plate and the first lower bottom, and a liquid sub-cavity is formed between the partition plate and the first upper cover. A liquid outlet and a liquid inlet of the working medium driver are provided on the liquid sub-cavity. The stator is located in the sealing sub-cavity. The rotor is located in the liquid sub-cavity. The rotor is configured to rotate under an action of a magnetic field generated by the stator, to drive the working medium in the liquid sub-cavity to flow. In this way, the stator can be separated from the working medium in the liquid sub-cavity by using the partition plate. When an electrical signal is provided for the stator, a magnetic field is generated around the stator. The rotor generates induced electromotive force in the magnetic field, thereby generating a current in a closed-loop rotor line. The current can enable another magnetic field to be generated around the rotor. When poles of the two magnetic fields are the same, repulsion occurs, so that the rotor rotates. When the rotor rotates, the working medium in the liquid sub-cavity can be driven to flow in the liquid sub-cavity, so that the working medium flows out of the liquid outlet from the liquid inlet of the working medium driver, to implement circulation of the working medium in a closed loop including the working medium driver, the primary flow-through structure, and the secondary flow-through structure.

Optionally, the working medium driver further includes a temperature sensor and a flow rate controller. The temperature sensor is located in the liquid sub-cavity, and is configured to detect temperature of the working medium in the liquid sub-cavity. The flow rate controller is electrically connected to the temperature sensor and the stator. The flow rate controller is configured to control, based on a detection result of the temperature sensor, a voltage applied to the stator. The temperature detected by the temperature sensor is directly proportional to the voltage applied to the stator. In this way, when the temperature of the working medium in the liquid sub-cavity is high, the voltage applied to the stator can be increased by using the flow rate controller, thereby increasing a rotational speed of the rotor, increasing a flow rate of the working medium, and improving efficiency of cooling down the heat emitting element. On the contrary, when the temperature of the working medium in the liquid sub-cavity is low, the flow rate of the working medium can be reduced.

Optionally, the working medium driver further includes a leakage detector. The leakage detector is electrically connected to the stator and the rotor, and the leakage detector is configured to: detect a voltage applied to the stator and a rotational speed of the rotor, and determine a volume of the working medium in the liquid sub-cavity based on the rotational speed of the rotor. In this way, an actual rotational speed of the rotor is detected by using the leakage detector, and the actual rotational speed is compared with a preset rotational speed. When the actual rotational speed is greater than the preset rotational speed, it may indicate that load of the rotor is reduced and therefore liquid leakage occurs in the liquid sub-cavity.

Optionally, the working medium driver further includes a plurality of blades that are disposed at intervals and that are connected to the rotor. The plurality of blades are disposed around an outer surface of the rotor. In this way, when the rotor rotates, the blades may be driven to rotate together, so that the blades can push the working medium in the liquid sub-cavity to flow in the rotation process.

Optionally, an included angle between the liquid inlet and the liquid outlet of the working medium driver is 0°, 90° or 180°. In this way, the working medium can enter an edge of the blade in the working medium driver from the liquid inlet, and then the working medium is driven by the blade to be thrown out of the liquid outlet from the edge of the blade in an acceleration manner, thereby completing driving of the working medium.

Optionally, the primary flow-through structure and the secondary flow-through structure each include at least one heat pipe. A capillary structure for dissipating heat is disposed in the heat pipe, thereby helping improve heat dissipation effects of the primary thermal plate and the secondary thermal plate.

Optionally, the first-level thermal component and the second-level thermal component are vapor chambers. A capillary structure for dissipating heat is disposed in the vapor chamber, thereby helping improve heat dissipation effects of the first-level thermal component and the second-level thermal component. Alternatively, in some other embodiments of this application, the first-level thermal component and the second-level thermal component may be cold plates (pipe sink). No capillary structure needs to be disposed in the cold plate, so that manufacturing processes of the first-level thermal component and the second-level thermal component are simpler.

Optionally, the thermal system further includes an auxiliary thermal component. The auxiliary thermal component is located between the heat emitting element and the primary thermal plate, and is in contact with the heat emitting element and the primary thermal plate. The auxiliary thermal component is a thermal fin or a thermoelectric cooling film. The thermal fin is made of a metal material and has a good heat conduction effect. In addition, when the auxiliary thermal component is the thermoelectric cooling film, if the thermoelectric cooling film is energized, a surface of a side with low temperature may be in contact with the heat emitting element, thereby facilitating heat dissipation of the heat emitting element.

Optionally, the first-level thermal component further includes a primary fan, and the primary fan is connected to the primary thermal plate. The second-level thermal component further includes a secondary fan, and the secondary fan is connected to the secondary thermal plate. In a rotation process, the primary fan can dissipate heat for the primary thermal plate that absorbs heat of the heat emitting element, to improve a heat dissipation effect of the primary thermal plate on the working medium. In a rotation process, the secondary fan can dissipate heat for the secondary thermal plate, to improve a heat dissipation effect of the secondary thermal plate on the working medium.

Optionally, the secondary flow-through structure includes at least one secondary channel extending through a plate structure of the secondary thermal plate. One end of each secondary channel communicates with a liquid inlet of the secondary thermal plate, and the other end communicates with a liquid outlet of the secondary thermal plate. Two adjacent secondary channels are separated by using the plate structure. In this way, the secondary channel can be used to steer the working medium flowing into the secondary flow-through structure, so that the working medium flows along a shape of the secondary channel.

Optionally, the secondary thermal plate includes a second upper cover, a second lower bottom, and a plurality of support bars that are disposed at intervals. The second lower bottom is connected to the second upper cover to form a cavity. The plurality of support bars that are disposed at intervals are located in the cavity, and are connected to the second upper cover and the second lower bottom. A secondary channel is formed between two adjacent support bars, and a plurality of secondary channels form the secondary flow-through structure. In this way, the secondary channels formed by using the plurality of support bars that are disposed at intervals can be used to steer the working medium flowing into the secondary flow-through structure, so that the working medium flows along a shape of the secondary channel.

Optionally, the secondary channel is spiral and does not intersect at any location. Because a side wall of the secondary channel is curved, resistance of the side wall of the secondary channel to the working medium can be effectively reduced in a process in which the working medium flows in the secondary channel. Therefore, the working medium can flow more smoothly in the secondary channel, and power consumption of the working medium driver is reduced.

Optionally, the secondary thermal plate further includes a plurality of support pillars located in the cavity. The support pillars are connected to the second upper cover and the second lower bottom. Therefore, a probability that cracking occurs between the support bars and both the second upper cover and the second lower bottom due to thermal expansion of the secondary thermal plate can be reduced.

According to a second aspect of the embodiments of this application, an electronic device is provided. The electronic device includes a first housing and a second housing that are rotatably connected, a display module mounted on the first housing, and a main board mounted on the second housing, where a heat emitting element is disposed on the main board. In addition, the electronic device further includes any one of the thermal systems described above. A first-level thermal component in the thermal system is disposed on the second housing, and a primary thermal plate of the first-level thermal component is in contact with the heat emitting element. A second-level thermal component in the thermal system is disposed on the first housing, and a secondary thermal plate of the second-level thermal component is connected to a back surface of the display module and the first housing. The electronic device has a same technical effect as the thermal system provided in the foregoing embodiment, and details are not described herein again.

Optionally, a working medium driver in the thermal system is located on the second housing, and is placed side by side with the second-level thermal component. Therefore, space occupied by the thermal system in the electronic device can be reduced.

According to a third aspect of the embodiments of this application, a thermal system is provided. The thermal system includes a first thermal component, a first working medium, a working medium driver, a second thermal component, and a second working medium. The first thermal component includes a primary thermal plate to be in contact with a heat emitting element, and a primary flow-through structure disposed in the primary thermal plate. A liquid outlet and a liquid inlet of the working medium driver communicate with the primary flow-through structure, and the working medium driver is configured to drive the first working medium to circulate in a closed loop including the working medium driver and the primary flow-through structure. The second thermal component includes a secondary thermal pipe, a fan and a secondary thermal plate. One end of the secondary thermal pipe is in contact with the heat emitting element, and the other end is located between an air outlet of the fan and the secondary thermal plate, and is connected to the fan and the secondary thermal plate. The second working medium is located in the secondary thermal pipe.

In this case, the working medium driver can drive the first working medium to flow from the liquid outlet of the working medium driver to the primary flow-through structure in the primary thermal plate. Because the primary thermal plate is in contact with the heat emitting element, heat of the heat emitting element is absorbed by using the first working medium. The first working medium that absorbs the heat flows back to the liquid inlet of the working medium driver, so that the first working medium performs cyclic heat dissipation on the heat emitting element. In addition, because one end of the secondary thermal pipe is in contact with the heat emitting element, the heat of the heat emitting element may enable the second working medium in the secondary thermal pipe to vaporize and flow to the other end that is of the secondary thermal pipe and that has relatively low temperature. Because the other end of the secondary thermal pipe is located between the air outlet of the fan and the secondary thermal plate, and is connected to the fan and the secondary thermal plate, heat of the second working medium in the secondary thermal pipe may be taken away by using the air outlet of the fan and the secondary thermal plate. In this way, after temperature of the second working medium is reduced, the second working medium condenses into a liquid state, and flows, in a direction shown by an arrow, back to the end that is of the secondary thermal pipe and that is in contact with the heat emitting element. Therefore, the second working medium can perform cyclic heat dissipation on the heat emitting element.

Optionally, the working medium driver includes a first upper cover, a first lower bottom, a partition plate, a stator, and a rotor. The first lower bottom is connected to the first upper cover to form an accommodation cavity. The partition plate is located in the accommodation cavity and connected to the first lower bottom. A sealing sub-cavity is formed between the partition plate and the first lower bottom, a liquid sub-cavity is formed between the partition plate and the first upper cover, and the liquid outlet and the liquid inlet of the working medium driver are provided on the liquid sub-cavity. The stator is located in the sealing sub-cavity. The rotor is located in the liquid sub-cavity. The rotor is configured to rotate under an action of a magnetic field generated by the stator, to drive the working medium in the liquid sub-cavity to flow. A technical effect of the working medium driver is the same as that described above, and details are not described herein again.

Optionally, the working medium driver further includes a plurality of blades that are disposed at intervals and that are connected to the rotor. The plurality of blades are disposed around an outer surface of the rotor. A technical effect of the blade is the same as that described above, and details are not described herein again.

Optionally, the first thermal component is a vapor chamber or a cold plate. The secondary thermal plate is a thermal fin. Technical effects of the vapor chamber, the thermal fin, and the cold plate are the same as those described above, and details are not described herein again.

Optionally, the secondary thermal pipe is a heat pipe. A technical effect of the heat pipe is the same as that described above, and details are not described herein again.

Optionally, the thermal system further includes an auxiliary thermal component. The auxiliary thermal component is located between the heat emitting element and the primary thermal plate, and is in contact with the heat emitting element and the primary thermal plate. The auxiliary thermal component is a thermal fin or a thermoelectric cooling film. A technical effect of the auxiliary thermal component is the same as that described above, and details are not described herein again.

According to a fourth aspect of the embodiments of this application, an electronic device is provided. The electronic device includes a rear housing, a display module mounted on the rear housing, and a main board located between the display module and the rear housing. A heat emitting element is disposed on the main board. The electronic device further includes any one of the thermal systems described above. The thermal system is located between the display module and the housing. Both a primary thermal plate of a first thermal component and a secondary thermal pipe of a second thermal component in the thermal system are in contact with the heat emitting element. The electronic device has a same technical effect as the thermal system provided in the foregoing embodiments, and details are not described herein again.

BRIEF DESCRIPTION OF THE DRAWINGS

FIG. 4b is a schematic diagram of cyclic heat dissipation of a working medium in the thermal system shown in FIG. 4a;

FIG. 5b is a schematic diagram of a structure of a working medium transmission structure in FIG. 5a;

FIG. 5c is another schematic diagram of a structure of a working medium transmission structure in FIG. 5a;

FIG. 5d is another schematic diagram of a structure of a working medium transmission structure in FIG. 5a;

FIG. 6b is a schematic diagram of a structure of a working medium transmission structure in FIG. 6a;

FIG. 6c is another schematic diagram of a structure of a working medium transmission structure in FIG. 6a;

FIG. 6d is another schematic diagram of a structure of a working medium transmission structure in FIG. 6a;

FIG. 7b is a schematic diagram of a structure of a first connection pipe and a second connection pipe in FIG. 7a;

FIG. 11a is a schematic diagram of a structure of a secondary channel in FIG. 10a;

FIG. 11b is a schematic diagram of a structure of a secondary channel in FIG. 10a;

FIG. 16b is a schematic diagram of structures of some components in the electronic device shown in FIG. 16a;

FIG. 17b is a schematic diagram of a structure of an electronic device having the thermal system shown in FIG. 17a; and FIG. 17c is a schematic diagram of cyclic heat dissipation of the thermal system shown in FIG. 17a.

REFERENCE NUMERALS

Figure 1:
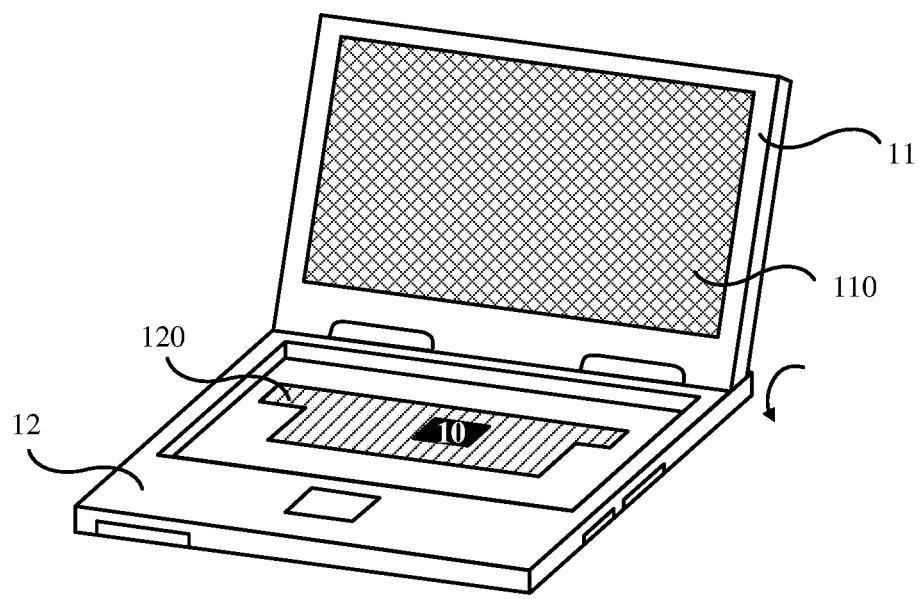
FIG. 1 is a schematic diagram of a structure of an electronic device according to some embodiments of this application.

01: electronic device; 10: heat emitting element; 11: first housing; 110: display module; 12: second housing; 120: main board; 100: system component; 101: liquid crystal display; 102: backlight unit; 02: thermal system; 20: first-level thermal component; 201: primary thermal plate; 202: primary flow-through structure; 30: second-level thermal component; 301: secondary thermal plate; 302: secondary flow-through structure; 40: working medium transmission component; 401: transmission channel; 50: working medium driver; 41: first working medium transmission portion; 42: second working medium transmission portion; 41a: right first working medium transmission portion; 41b: left second working medium transmission portion; 212: first primary channel; 222: second primary channel; 411: primary connection pipe; 412: secondary connection pipe; 413: rotary connection pipe; 414: sealing component; 400: hose; 402: lyophobic coating; 415: groove; 4110: first mounting part; 4120: second mounting part; 421: first connection pipe; 422: second connection pipe; 423: third connection pipe; 424: fourth connection pipe; 420: metal portion; 430: resin portion; 60: auxiliary thermal component; 3021: secondary channel; 3011: second upper cover; 3012: second lower bottom; 3013: cavity; 3014: support bar; 3015: support pillar; 3026: protrusion; 501: first upper cover; 502: first lower bottom; 503: accommodation cavity; 510: sealing sub-cavity; 511: liquid sub-cavity; 504: partition plate; 505: stator; 506: rotor; 520: temperature sensor; 521: flow rate controller; 522; leakage detector; 530: blade; 203: primary fan; 303: secondary fan; 111: middle frame; 112: rear housing; 70: first thermal component; 71: second thermal component; vii: secondary thermal pipe; 712: fan.

DETAILED DESCRIPTION OF ILLUSTRATIVE EMBODIMENTS

The following describes the technical solutions in the embodiments of this application with reference to the accompanying drawings in the embodiments of this application. It is clearly that, the described embodiments are merely a part rather than all of the embodiments of this application.

The following terms "first" and "second" are merely intended for a purpose of description, and shall not be understood as an indication or implication of relative importance or implicit indication of the number of indicated technical features. Therefore, a feature limited by "first" or "second" may explicitly or implicitly include one or more features. In the description of this application, unless otherwise stated, "a plurality of" means two or more than two.

In addition, in this application, direction terms such as "up", "down", "left", and "right" are defined relative to directions of schematically placed components in the accompanying drawings. It should be understood that these direction terms are relative concepts, and the direction terms are used for relative description and clarification and may vary accordingly depending on the directions in which the components are placed in the accompanying drawings.

In this application, unless otherwise expressly specified and limited, the term "connection" should be understood broadly. For example, the "connection" may be a fixed connection, a detachable connection, or an integral connection, may be a direct connection, or may be an indirect connection based on an intermediate medium.

An embodiment of this application provides an electronic device. The electronic device includes, for example, a mobile phone, a tablet computer, a notebook computer, an in-vehicle computer, and an intelligent wearable product. A specific form of the electronic device is not particularly limited in this embodiment of this application.

In some embodiments of this application, an example in which an electronic device 01 is a notebook computer shown in FIG. 1 is used for description.

In this case, as shown in FIG. 1, the electronic device 01 includes a first housing 11 and a second housing 12 that are rotatably connected. The electronic device 01 further includes a display module no mounted on the first housing 11. The display module no is configured to display an image. The display module no has a display surface for displaying an image, and a back surface away from the display panel. The back surface of the display module no faces the first housing 11 shown in FIG. 1.

Figure 2:
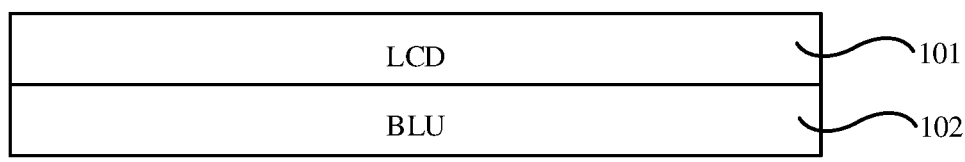
FIG. 2 is a schematic diagram of a structure of a display module in FIG. 1.

In some embodiments of this application, the display module no is a liquid crystal display module. In this case, as shown in FIG. 2, the display module no includes a liquid crystal display (liquid crystal display, LCD) 101 and a backlight unit (backlight unit, BLU) 102 that is located on a back surface (a surface away from a side that is of the LCD 101 and that is used to display a picture) of the liquid crystal display 101.

The BLU 102 may provide a light source for the liquid crystal display 101, so that each sub pixel (sub pixel) in the liquid crystal display 101 can emit light to display an image.

Alternatively, in some other embodiments of this application, the display module 110 may be an organic light emitting diode (organic light emitting diode, OLED) display. Because each sub pixel of the OLED display is provided with an electroluminescence layer, the OLED display can implement self-luminescence after receiving a working voltage. In this case, there is no need to provide the BLU in the display module no that has the OLED display.

In addition, as shown in FIG. 1, the electronic device 01 further includes a main board 120 mounted on the second housing 12, and a heat emitting element 10 mounted on the main board 120. The heat emitting element 10 may be an SOC, a central processing unit (central processing unit, CPU), or a graphics processing unit (graphics processing unit, GPU). The main board 120 may be a printed circuit board (printed circuit board, PCB). The main board 120 is electrically connected to a drive circuit on the display module 110, so that a processor on the PCB can be used to control the display module no to display an image.

Figure 3A:
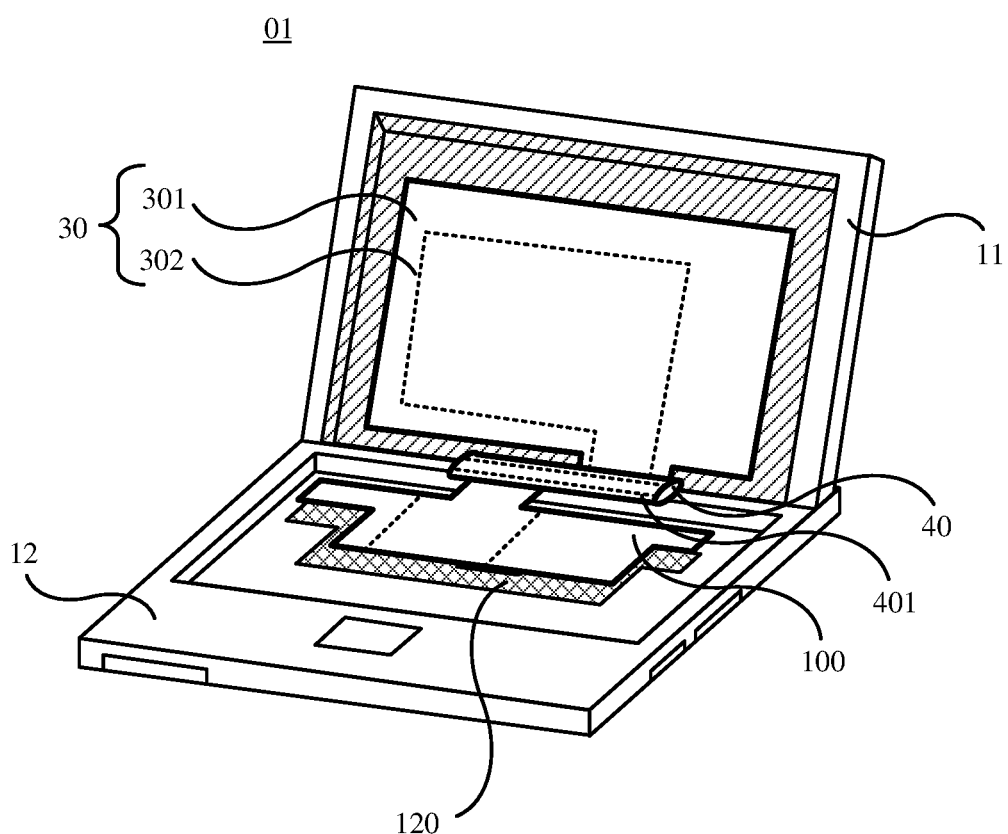
FIG. 3a is a schematic diagram of a structure of a thermal system according to an embodiment of this application.

On this basis, to dissipate heat for the heat emitting element 10, the electronic device 01 further includes a thermal system 02 shown in FIG. 3a. The thermal system 02 includes a system component 100 disposed on the second housing 12, a second-level thermal component 30 disposed on the first housing 11, and a working medium transmission component 40 located between the system component 100 and the second-level thermal component 30.

Figure 3B:
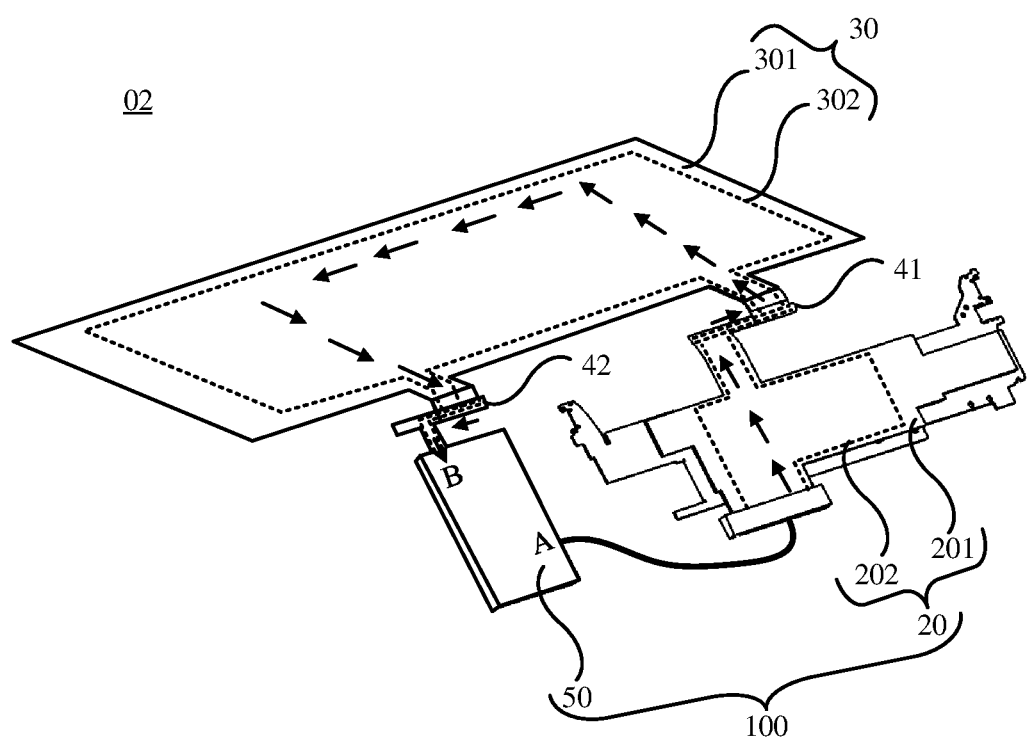
FIG. 3b is a schematic diagram of a structure of an electronic device that has a thermal system according to an embodiment of this application.

The system component 100 includes a first-level thermal component 20 and a working medium driver 50 that are shown in FIG. 3b. The first-level thermal component 20 includes a primary thermal plate 201 in contact with the heat emitting element 10 (as shown in FIG. 1), and a primary flow-through structure 202 that is disposed in the primary thermal plate 201 and through which a working medium flows.

The second-level thermal component 30 includes a secondary thermal plate 301, and a secondary flow-through structure 302 that is disposed in the secondary thermal plate 301 and through which the working medium flows. As shown in FIG. 3a, the secondary thermal plate 301 is located between the back surface of the display module no (as shown in FIG. 1) and the first housing 11, and is connected to the display module no and the first housing 11.

In addition, as shown in FIG. 3a, the working medium transmission component 40 is rotatably connected to the system component 100 and the secondary thermal plate 301. Therefore, when the first housing 11 and the second housing 12 of the electronic device 01 relatively rotate, the system component 100 and the secondary thermal plate 301 may relatively rotate by using the working medium transmission component 40.

There is a transmission channel 401 in the working medium transmission component 40. The transmission channel 401 of the working medium transmission component 40 is used to communicate at least the primary flow-through structure 202 and the secondary flow-through structure 302.

In addition, the working medium driver 50 has a liquid outlet and a liquid inlet. The thermal system 02 further includes the working medium located in the primary flow-through structure 202, the secondary flow-through structure 302, and the working medium driver 50. The working medium driver 50 is configured to drive the working medium to flow through the primary flow-through structure 202, the secondary flow-through structure 302, and the transmission channel 401 in the working medium transmission component 40.

In some embodiments of this application, as shown in FIG. 3b, the working medium transmission component 40 includes a first working medium transmission portion 41 and a second working medium transmission portion 42. The first working medium transmission portion 41 is rotatably connected to the primary thermal plate 201 and the secondary thermal plate 301. A transmission channel in the first working medium transmission portion 41 communicates with the primary flow-through structure 202 in the primary thermal plate 201 and the secondary flow-through structure 302 in the secondary thermal plate 301.

In addition, the second working medium transmission portion 42 is rotatably connected to the secondary thermal plate 301 and the working medium driver 50. A transmission channel in the second working medium transmission portion 42 communicates with the secondary flow-through structure 302 in the secondary thermal plate 301 and the liquid inlet B of the working medium driver 50. The liquid outlet A of the working medium driver 50 communicates with the primary flow-through structure 202 in the primary thermal plate 201.

On this basis, to reduce space occupied by the thermal system 02 in the second housing 12, as shown in FIG. 3b, the working medium driver 50 in the thermal system 02 may be placed side by side with the second-level thermal component 30. For example, the working medium driver is placed on the left or right of the primary thermal plate 201 in the second-level thermal component 30.

In this case, the working medium driver 50 can drive the working medium to be transmitted from the liquid outlet A of the working medium driver 50 to the primary flow-through structure 202 in the primary thermal plate 201 in an arrow direction shown in FIG. 3b. The primary thermal plate 201 is in contact with the heat emitting element 10 (as shown in FIG. 1) on the main board 120 shown in FIG. 3b. Therefore, when flowing through the primary thermal plate 201, the working medium can absorb heat of the heat emitting element 10, so that the heat emitting element 10 can be cooled down, thereby dissipating heat for the heat emitting element 10.

Then, driven by the working medium driver 50, the working medium that absorbs the heat of the heat emitting element 10 flows into the secondary flow-through structure 302 in the secondary thermal plate 301 after passing through the first working medium transmission portion 41. The secondary thermal plate 301 is connected to the first housing 11. Therefore, a part of heat in the working medium can be absorbed by using the first housing 11, so that temperature of the working medium can be reduced.

Then, driven by the working medium driver 50, the working medium that is cooled down may be transmitted to the liquid inlet B (as shown in FIG. 3a) of the working medium driver 50 by using the second working medium transmission portion 42. Therefore, after being driven by the working medium driver 50, the working medium enters the primary flow-through structure 202 in the primary thermal plate 201 again from the liquid outlet A of the working medium driver 50, to perform a next heat dissipation process.

In this way, when the working medium driver 50 drives the working medium to circulate in a closed loop including the working medium driver 50, the primary flow-through structure 202, and the secondary flow-through structure 302, the working medium can continuously absorb heat of the heat emitting element 10 to transfer the heat to the first housing 11 for heat dissipation, thereby dissipating heat for the heat emitting element 10.

Figure 4A:
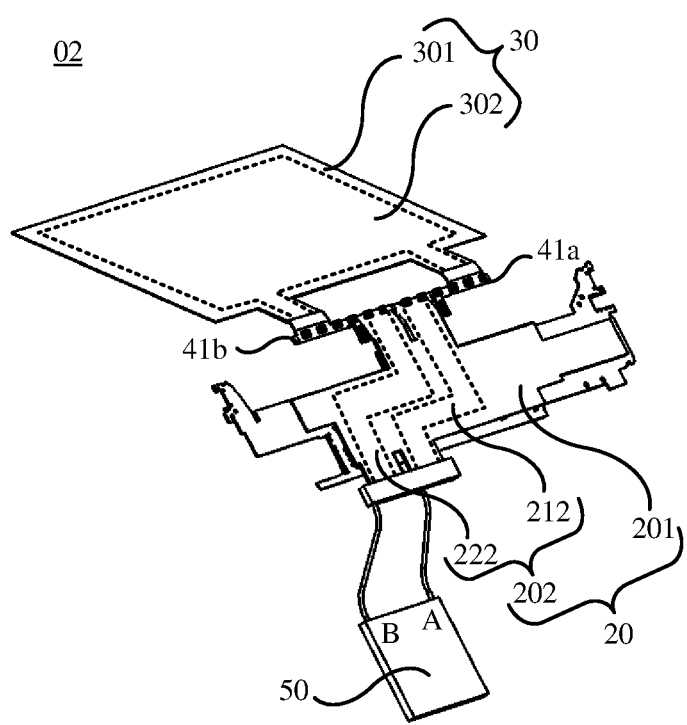
FIG. 4a is a schematic diagram of a structure of another thermal system according to an embodiment of this application.

Alternatively, in some other embodiments of this application, the working medium transmission component 40 in the thermal system 02 of the electronic device 01 includes two first working medium transmission portions that are configured to rotatably connect the primary thermal plate 201 to the secondary thermal plate 301. The two first working medium transmission portions are respectively a right first working medium transmission portion 41a and a left first working medium transmission portion 41b that are shown in FIG. 4a.

Figure 4B:
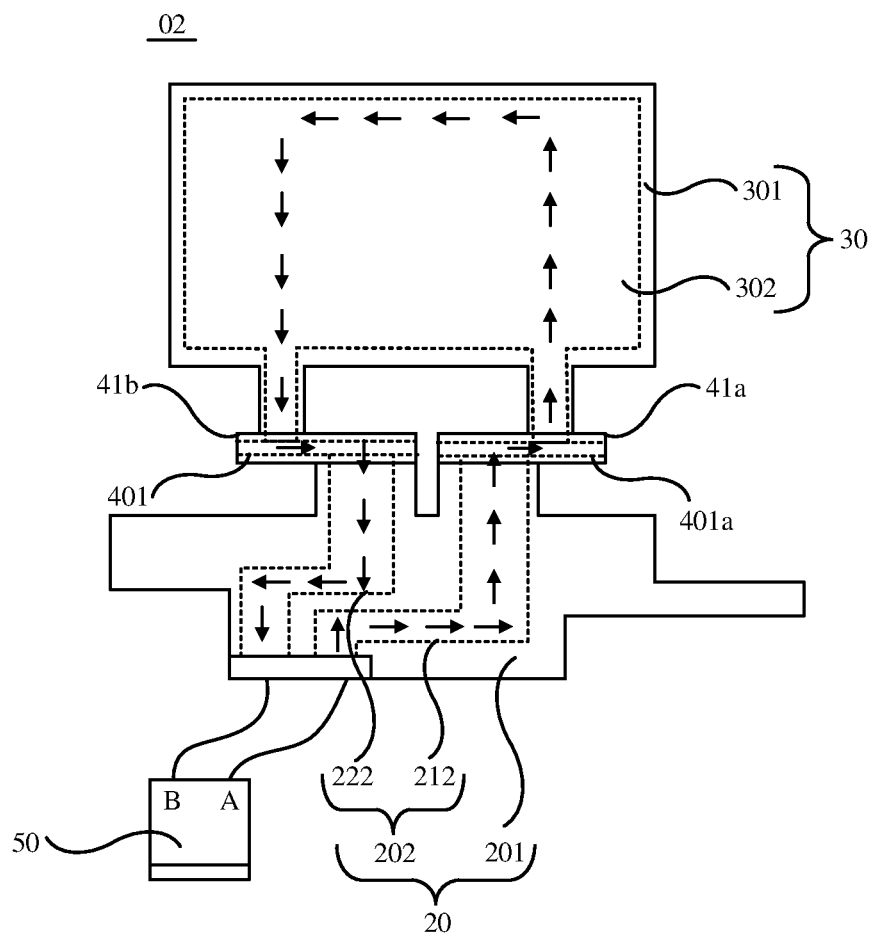

In addition, as shown in FIG. 4b, the primary flow-through structure 202 in the primary thermal plate 201 includes a first primary channel 212 and a second primary channel 222. The liquid outlet A of the working medium driver 50 communicates with the first primary channel 212 in the primary thermal plate 201, and the liquid inlet B communicates with the second primary channel 222.

A transmission channel in the right first working medium transmission portion 41a communicates with the first primary channel 212 and the secondary flow-through structure 302. A transmission channel in the left first working medium transmission portion 41b communicates with the secondary flow-through structure 302 and the second primary channel 222.

In this case, the working medium driver 50 can drive the working medium to be transmitted from the liquid outlet A of the working medium driver 50 to the first primary channel 212 in the primary thermal plate 201 in an arrow direction shown in FIG. 4b. The primary thermal plate 201 is in contact with the heat emitting element 10 on the main board 120. Therefore, when flowing through the primary thermal plate 201, the working medium can absorb heat of the heat emitting element 10, so that the heat emitting element 10 can be cooled down, thereby dissipating heat for the heat emitting element 10.

Then, driven by the working medium driver 50, the working medium that absorbs the heat of the heat emitting element 10 flows into the secondary flow-through structure 302 in the secondary thermal plate 301 through the transmission channel 401a in the right first working medium transmission portion 41a. The secondary thermal plate 301 is connected to the first housing 11. Therefore, a part of heat in the working medium can be absorbed by using the first housing 11, so that temperature of the working medium can be reduced.

Then, driven by the working medium driver 50, the working medium that is cooled down may flow from the secondary flow-through structure 302 in the secondary thermal plate 301 to the second primary channel 222 in the primary thermal plate 201 after passing through the left first working medium transmission portion 41b, and then enter the liquid inlet B of the working medium driver 50 through the second primary channel 222. Therefore, a next heat dissipation process is performed again after the working medium is driven by the working medium driver 50.

It should be noted that flow of the working medium is described by using an example in which the liquid outlet A of the working medium driver 50 communicates with the first primary channel 212 in the primary thermal plate 201 and the liquid inlet B communicates with the second primary channel 222. In some other embodiments of this application, alternatively, the liquid inlet B of the working medium driver 50 may communicate with the first primary channel 212 in the primary thermal plate 201, and the liquid outlet A may communicate with the second primary channel 222. A flow process of the working medium is similar to that described above, and details are not described herein.

Figure 4C:
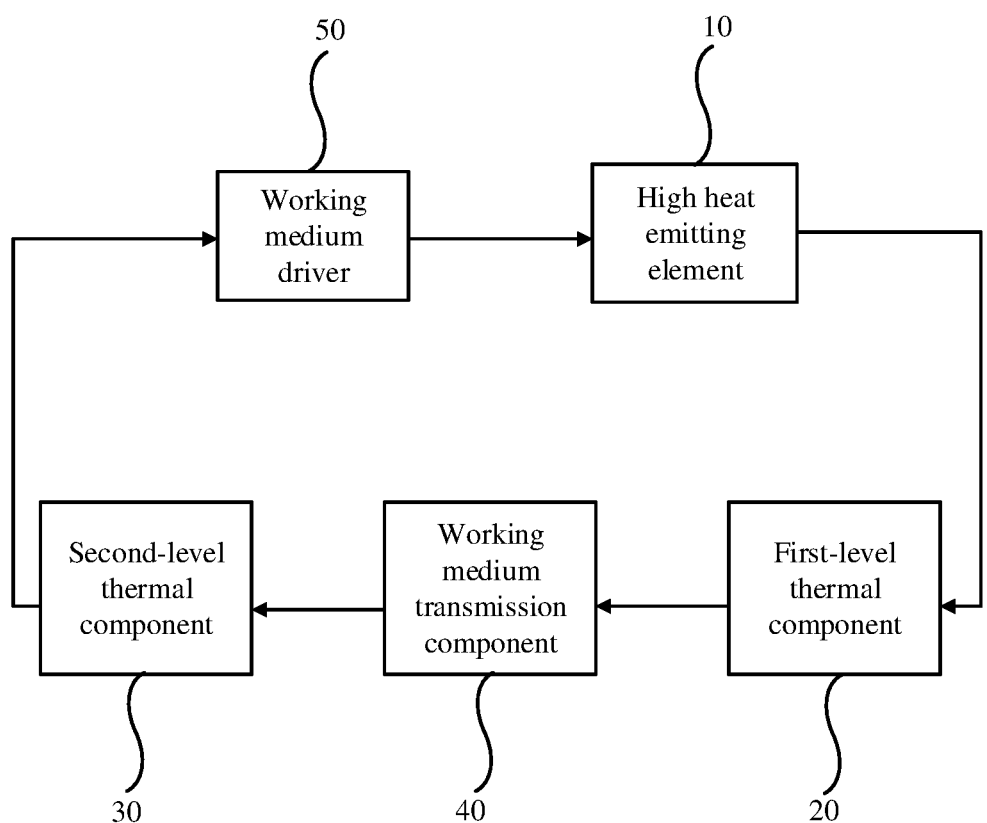
FIG. 4c is a schematic diagram of a cyclic structure of another thermal system according to an embodiment of this application.

In this way, when the working medium driver 50 drives the working medium to circulate in a closed loop that is shown in FIG. 4c and that includes the working medium driver 50, the primary flow-through structure 202 of the first-level thermal component 20, the working medium transmission component 40, and the secondary flow-through structure 302 of the second-level thermal component 30, the working medium can continuously absorb heat of the heat emitting element 10 to transfer the heat to the first housing 11 for heat dissipation, thereby dissipating heat for the heat emitting element 10.

The following uses an example to describe a structure of the working medium transmission component 40 based on a connection manner of the liquid inlet B and the liquid outlet A of the working medium driver 50 in the thermal system 02.

EXAMPLE 1

In this example, an example in which the thermal system 02 is the structure shown in FIG. 3b is used to describe a structure of the first working medium transmission portion 41.

It can be learned from the foregoing description that the first working medium transmission portion 41 in the thermal system 02 may communicate the primary flow-through structure 202 on the primary thermal plate 201 and the secondary flow-through structure 302 on the secondary thermal plate 301, and the first working medium transmission portion 41 may further enable the primary thermal plate 201 to be rotatably connected to the secondary thermal plate 301. To enable the first working medium transmission portion 41 to implement the functions, the first working medium transmission portion 41 includes a primary connection pipe 411, a secondary connection pipe 412, and a rotary connection pipe 413 shown in FIG. 5a.

Figure 5A:
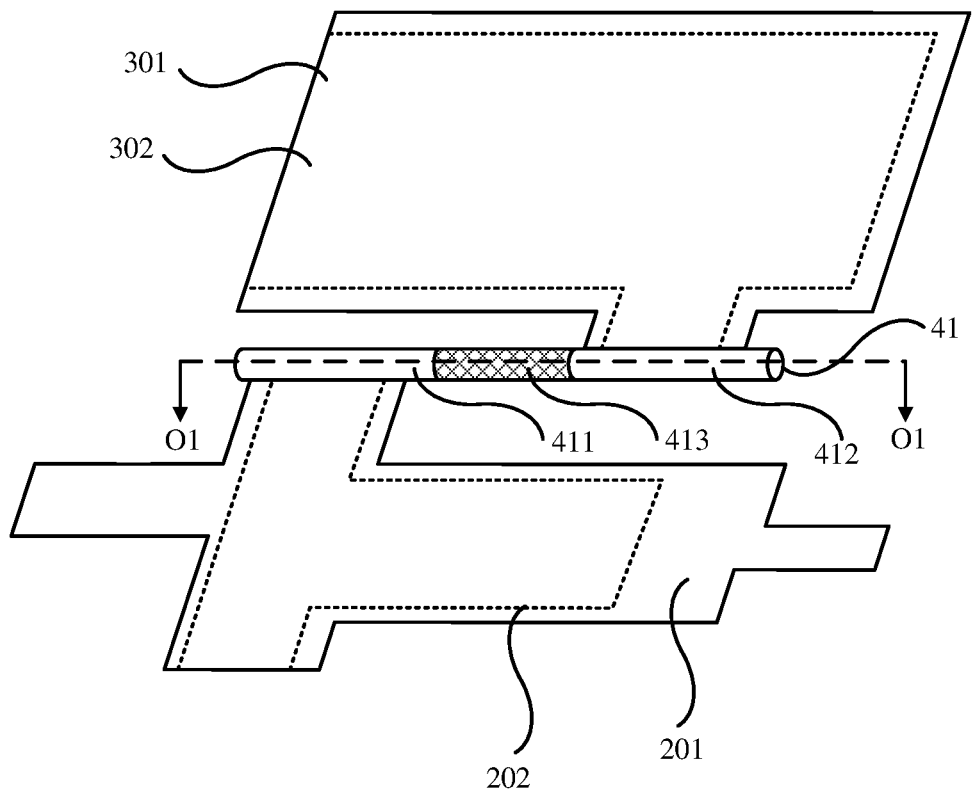
FIG. 5a is a schematic diagram of a structure of another thermal system according to an embodiment of this application.
Figure 5B:
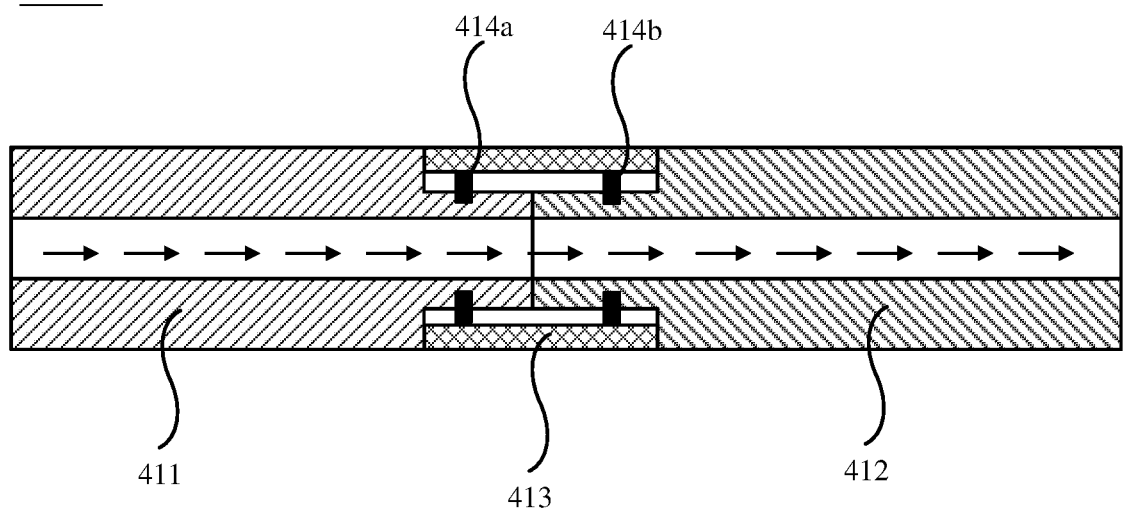

As shown in FIG. 5a, the primary connection pipe 411 is connected to the primary thermal plate 201. The secondary connection pipe 412 is connected to the secondary thermal plate 301. In addition, as shown in FIG. 5b (a sectional view obtained by performing section along O1-O1 shown in FIG. 5a), one end of the primary connection pipe 411 is butted with one end of the secondary connection pipe 412, so that an inner hole of the primary connection pipe 411 communicates with an inner hole of the secondary connection pipe 412.

In some embodiments of this application, the inner hole of the primary connection pipe 411 and the inner hole of the secondary connection pipe 412 may be used as the transmission channel in the first working medium transmission portion 41. Therefore, the working medium can flow from the inner hole of the primary connection pipe 411 to the inner hole of the secondary connection pipe 412 in an arrow direction shown in FIG. 5b, so that the working medium can be transmitted in the first working medium transmission portion 41.

Figure 5C:
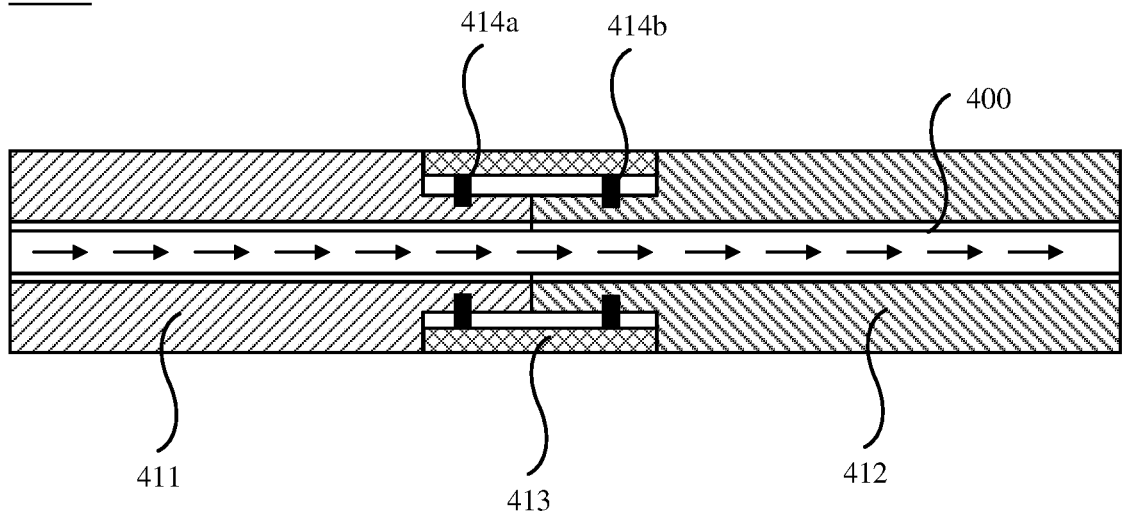

Alternatively, in some other embodiments of this application, the first working medium transmission portion 41 further includes a hose 400 shown in FIG. 5c. A material of the hose 400 may be a flexible resin material. The hose 400 passes through the inner hole of the primary connection pipe 411 and the inner hole of the secondary connection pipe 412. In addition, one end of the hose 400 communicates with the primary flow-through structure 202 in the primary thermal plate 201 (as shown in FIG. 5a), and the other end communicates with the secondary flow-through structure 302 in the secondary thermal plate 301 (as shown in FIG. 5b).

In this case, an inner hole of the hose 400 serves as the transmission channel in the first working medium transmission portion 41. Therefore, the working medium can flow through the inner hole of the hose 400 in an arrow direction shown in FIG. 5c, so that the working medium can be transmitted in the first working medium transmission portion 41.

Figure 5D:
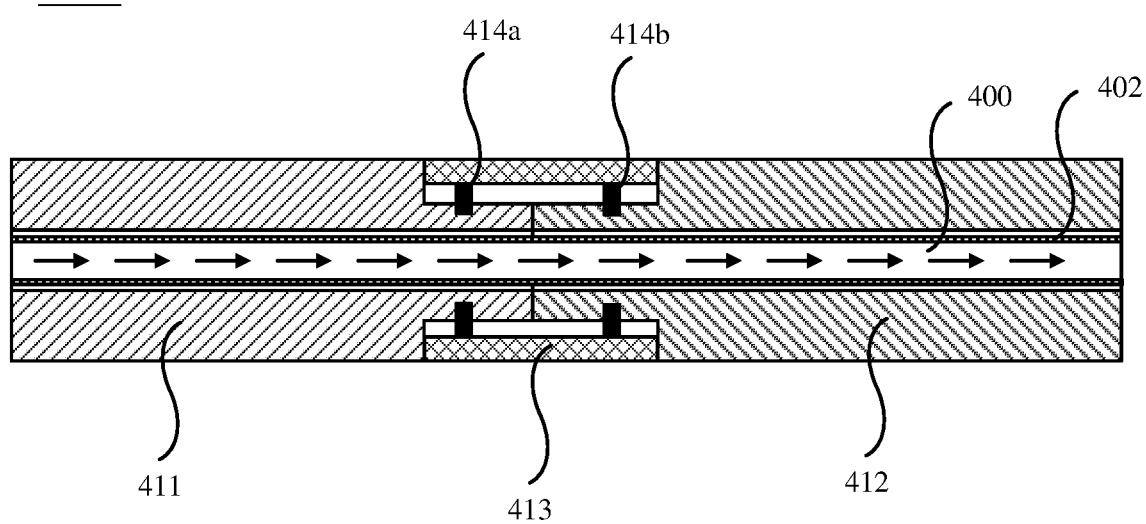

On this basis, the first working medium transmission portion 41 further includes a lyophobic coating 402 covering an outer surface of the hose 400 shown in FIG. 5d. The lyophobic coating 402 can be used to reduce a probability that polymer leakage occurs in the working medium in the hose 400 when the working medium passes through the hose 400. In this embodiment of this application, the lyophobic coating 402 may be a nanocoating made of a nanomaterial or a coating made of an ultraviolet (ultraviolet, UV) cured material.

In addition, to enable the primary connection pipe 411 and the secondary connection pipe 412 to relatively rotate, as shown in FIG. 5d, a part at which the primary connection pipe 411 is butted with the secondary connection pipe 412 is nested in the rotary connection pipe 413, so that the secondary connection pipe 412 and the primary connection pipe 411 are rotatably connected by using the rotary connection pipe 413.

It should be noted that, in this embodiment of this application, a material of the rotary connection pipe 413 may be a hard metal material, or may be a flexible resin material. This is not limited in this application.

On this basis, to reduce a probability that liquid leakage occurs in the working medium transmission component 40 in a process in which the working medium is transmitted in the first working medium transmission portion 41, as shown in FIG. 5d, the first working medium transmission portion 41 further includes at least one sealing component. An example in which the first working medium transmission portion 41 has two sealing components (414a, 414b) is used for description in FIG. 5d.

One sealing component 414a is located between a hole wall of an inner hole of the rotary connection pipe 413 and an outer wall of the primary connection pipe 411. The other sealing component 414b is located between the hole wall of the inner hole of the rotary connection pipe 413 and an outer wall of the secondary connection pipe 412.

Figure 5E:
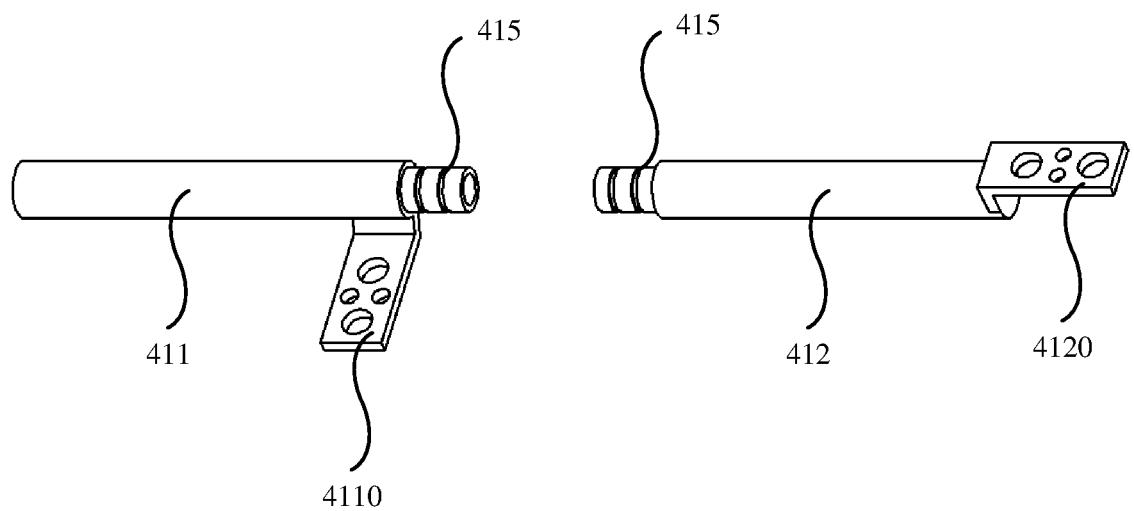
FIG. 5e is a schematic diagram of a structure of a primary connection pipe and a secondary connection pipe in FIG. 5b.

The sealing component may be a sealing ring. In this case, to fasten the sealing ring, as shown in FIG. 5e, an annular groove 415 may be produced on the outer wall of the primary connection pipe 411 (or the secondary connection pipe 412). In this way, the sealing ring may be sleeved on the outer wall of the primary connection pipe 411 (or the secondary connection pipe 412) and clamped in the annular groove 415, thereby preventing a sealing effect from being reduced due to large displacement of the sealing ring when the secondary connection pipe 412 and the primary connection pipe 411 relatively rotate.

In addition, to mount the first working medium transmission portion 41 in the electronic device 01, as shown in FIG. 5e, a first mounting part 4110 may be disposed on the primary connection pipe 411, and a second mounting part 4120 may be disposed on the secondary connection pipe 412. In this case, a threaded connector such as a screw or a bolt may be used to pass through a through hole on the first mounting part 4110 to fasten the primary connection pipe 411 to a component of the electronic device 01, for example, the second housing 12. In addition, the threaded connector may be used to pass through a through hole on the second mounting part 4120 to fasten the secondary connection pipe 412 to a component of the electronic device 01, for example, the first housing 11.

It should be noted that the structure of the first working medium transmission portion 41 is used as an example for description above. A structure of the second working medium transmission portion 42 that is configured to rotatably connect the secondary thermal plate 301 to the working medium driver 50 is similar to that described above, and details are not described herein again.

EXAMPLE 2

Figure 6A:
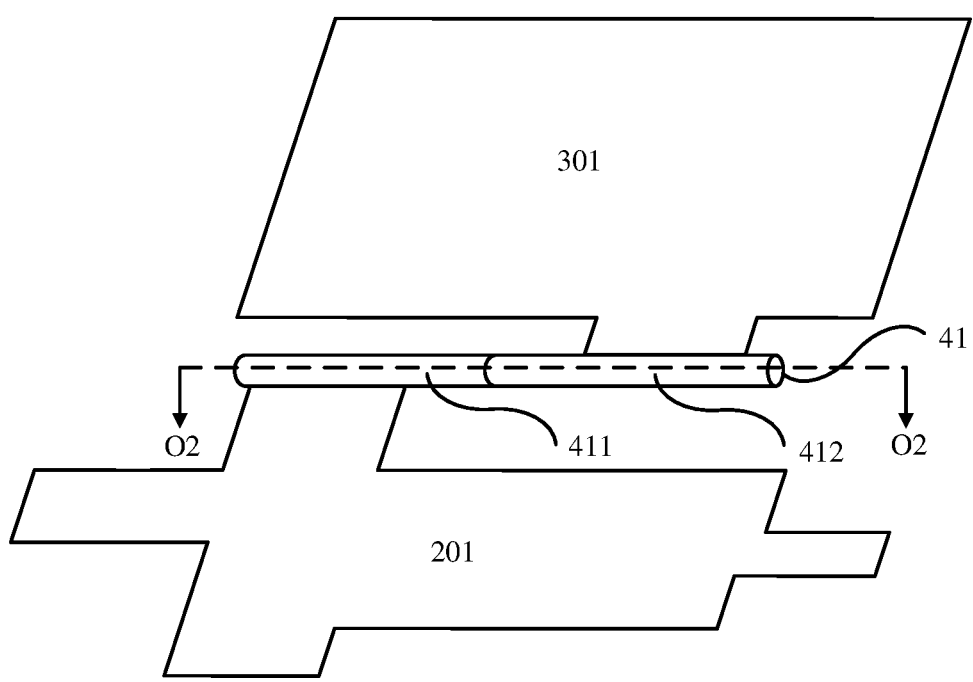
FIG. 6a is a schematic diagram of a structure of another thermal system according to an embodiment of this application.

This example is the same as Example 1, and in this example, an example in which the thermal system 02 is the structure shown in FIG. 3b is used to describe a structure of the first working medium transmission portion 41. A difference from Example 1 in that, as shown in FIG. 6a, the structure of the first working medium transmission portion 41 includes a primary connection pipe 411 and a secondary connection pipe 412. The primary connection pipe 411 is connected to the primary thermal plate 201. The secondary connection pipe 412 is connected to the secondary thermal plate 301.

Figure 6B:
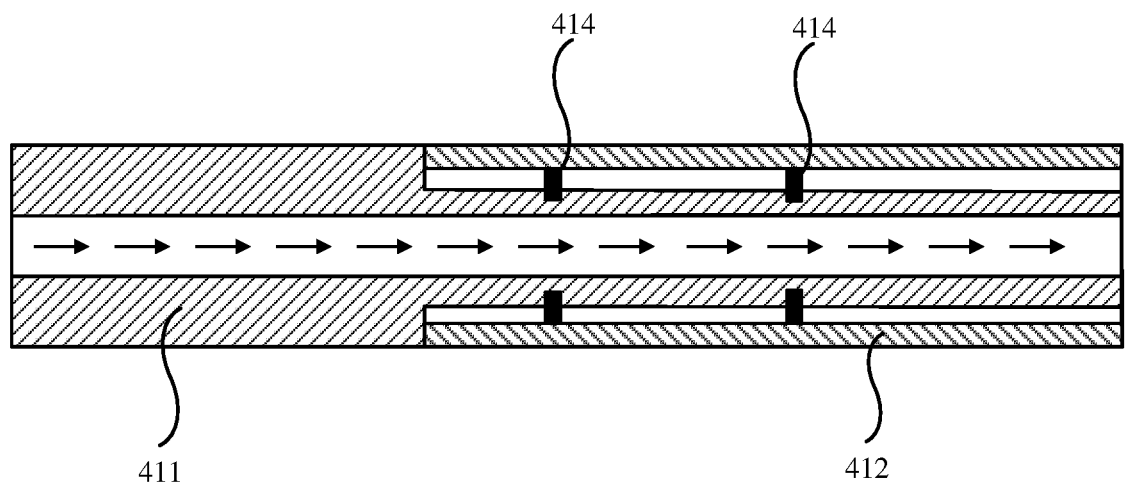

For example, as shown in FIG. 6b (a sectional view obtained by performing section along O2-O2 in FIG. 6a), a part of the primary connection pipe 411 extends into an inner hole of the secondary connection pipe 412. In addition, to reduce a probability of liquid leakage of the working medium, the working medium transmission component 40 further includes a sealing component 414. The sealing component 414 is located between an outer wall of the primary connection pipe 411 and a hole wall of the inner hole of the secondary connection pipe 412. The sealing component 414 may be a sealing ring, a manner of disposing the sealing ring is the same as that described above, and details are not described herein again.

Similarly, in some embodiments of this application, an inner hole of the primary connection pipe 411 may serve as the transmission channel in the first working medium transmission portion 41. Therefore, the working medium can flow in an arrow direction shown in FIG. 6b, so that the working medium can be transmitted in the first working medium transmission portion 41.

Figure 6C:
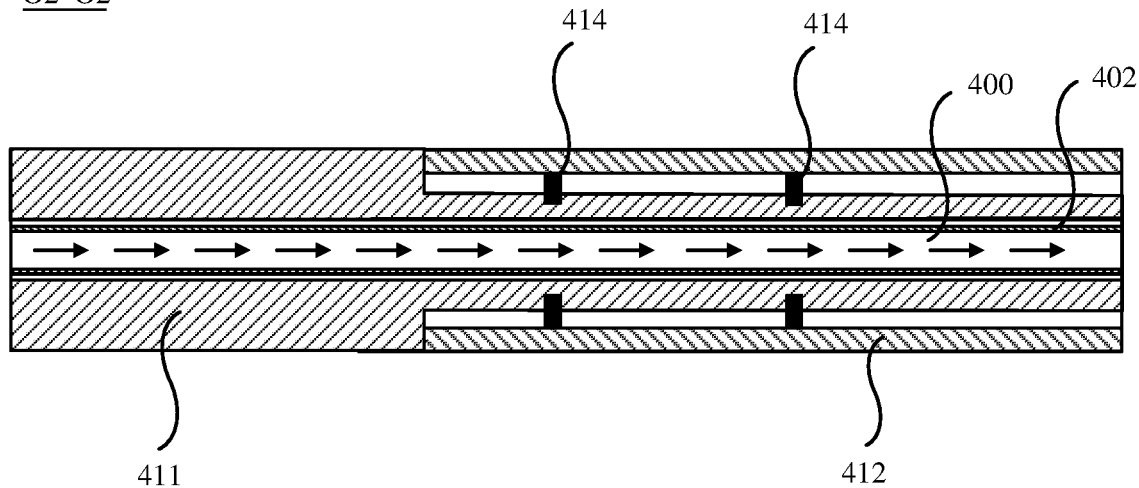

Alternatively, in some other embodiments of this application, the first working medium transmission portion 41 further includes a hose 400 shown in FIG. 6c. The hose 400 passes through the inner hole of the primary connection pipe 411 and communicates with the primary flow-through structure 202 in the primary thermal plate 201 and the secondary flow-through structure 302 in the secondary thermal plate 301 (as shown in FIG. 5b). In this case, an inner hole of the hose 400 serves as the transmission channel in the first working medium transmission portion 41. Therefore, the working medium can flow through the inner hole of the hose 400 in an arrow direction shown in FIG. 6c, so that the working medium can be transmitted in the working medium transmission component 40. In addition, an outer wall of the hose 400 may be provided with the lyophobic coating 402.

Figure 6D:
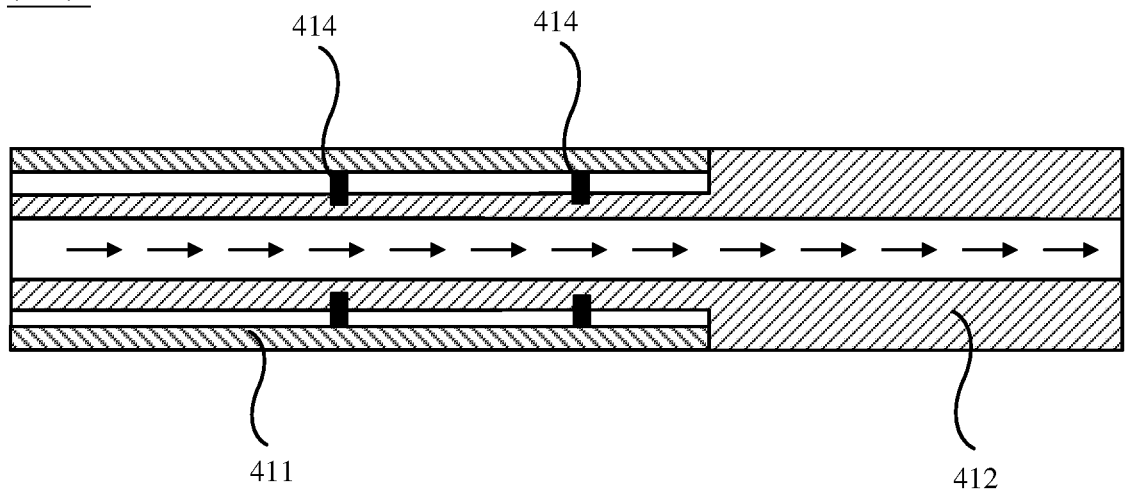

Alternatively, for another example, as shown in FIG. 6d (a sectional view obtained by performing section along O2-O2 in FIG. 6a), a part of the secondary connection pipe 412 extends into an inner hole of the primary connection pipe 411. In this case, the sealing component 414 is located between an outer wall of the secondary connection pipe 412 and a hole wall of the inner hole of the primary connection pipe 411. In this case, a manner of disposing the transmission channel in the first working medium transmission portion 41 is the same as that described above, and details are not described herein again.

It should be noted that the structure of the first working medium transmission portion 41 is used as an example for description above. A structure of the second working medium transmission portion 42 that is configured to rotatably connect the secondary thermal plate 301 to the working medium driver 50 is similar to that described above, and details are not described herein again.

EXAMPLE 3

Figure 7A:
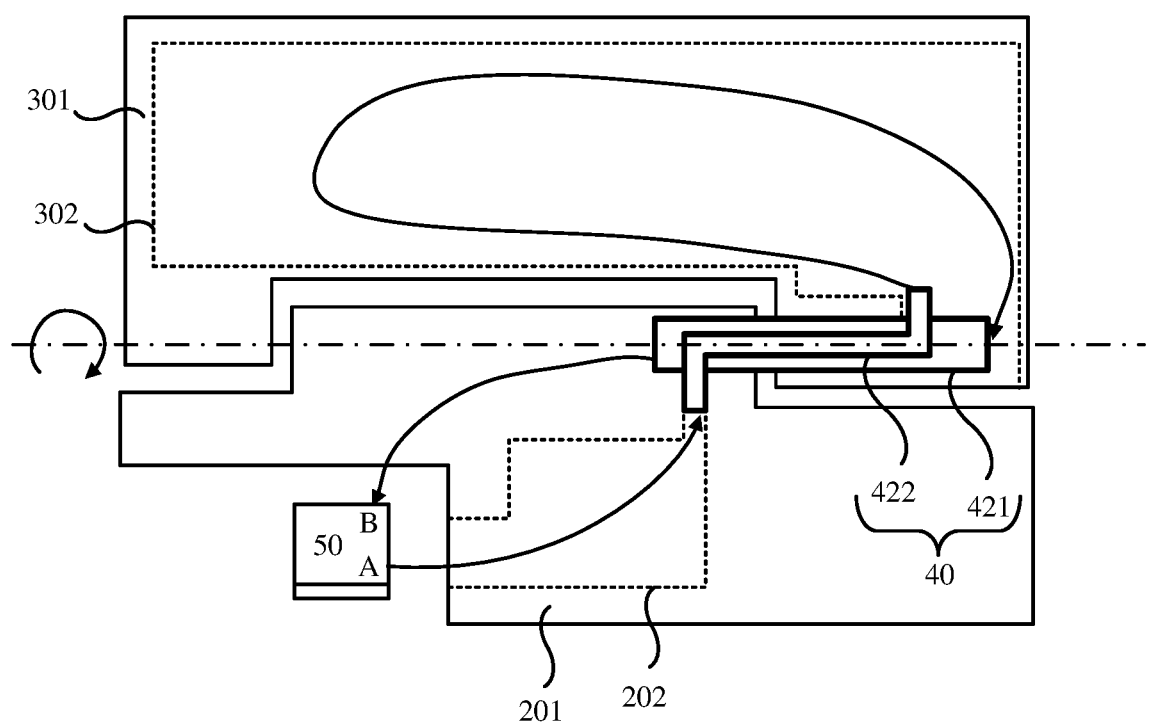
FIG. 7a is a schematic structural diagram of another thermal system according to an embodiment of this application.

In this example, as shown in FIG. 7*a*, the structure of the working medium transmission component 40 includes a first connection pipe 421 and a second connection pipe 422. The second connection pipe 422 is nested in an inner hole of the first connection pipe 421. As shown in FIG. 7*a*, the first connection pipe 421 is rotatably connected to the primary thermal plate 201 and the secondary thermal plate 301.

As shown in FIG. 7*a*, the liquid outlet A of the working medium driver 50 communicates with the primary flow-through structure 202 in the primary thermal plate 201, and the inner hole of the first connection pipe 421 communicates with the liquid inlet B of the working medium driver 50 and the secondary flow-through structure 302 in the secondary thermal plate 301. An inner hole of the second connection pipe 422 communicates with the primary flow-through structure 202 in the primary thermal plate 201 and the secondary flow-through structure 302 in the secondary thermal plate 301.

Figure 7B:
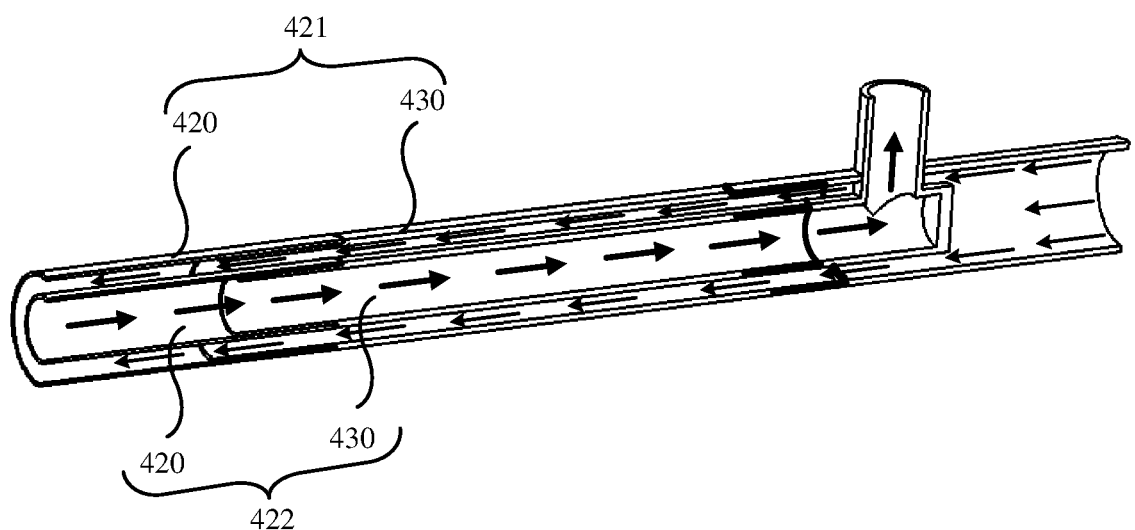

To enable the primary thermal plate 201 and the secondary thermal plate 301 to relatively rotate by using the first connection pipe 421, at least a part that is in each of the first connection pipe 421 and the second connection pipe 422 and that is located between the primary thermal plate 201 and the secondary thermal plate 301 is made of a flexible material such as a resin material. On this basis, in a process of manufacturing the first connection pipe 421, a metal portion 420 and a resin portion 430 that are shown in FIG. 7*b* may be connected together by using an injection molding process, to form the first connection pipe 421 in which the resin material and the metal material are spliced together. Similarly, the metal portion 420 and the resin portion 430 that are shown in FIG. 7*b* may be connected together by using the injection molding process, to form the second connection pipe 422 in which the resin material and the metal material are spliced together. Alternatively, in some other embodiments of this application, a manner of disposing the first connection pipe 421 may be the same as that of disposing the first working medium transmission portion 41, and details are not described herein again.

On this basis, the working medium that is output from the liquid outlet A of the working medium driver flows into the primary flow-through structure 202 in an arrow direction shown in FIG. 7*a*. Then, the working medium flows in the inner hole of the second connection pipe 422 in a right arrow direction in FIG. 7*b*. Next, the working medium flows from the second connection tube 422 to the secondary flow-through structure 302 in the secondary thermal plate 301 shown in FIG. 7*a*. Subsequently, the working medium in the secondary flow-through structure 302 flows into the first connection pipe 421 in the arrow direction shown in FIG. 7*a*, and flows in the inner hole of the first connection pipe 421 in a left arrow direction in FIG. 7*b*. Then, as shown in FIG. 7*a*, after flowing through the first connection pipe 421, the working medium flows back to the liquid inlet B of the working medium driver 50. Therefore, after being driven by the working medium driver 50, the working medium enters the primary flow-through structure 202 in the primary thermal plate 201 again from the liquid outlet A of the working medium driver 50, to perform a next heat dissipation process.

It can be learned from the foregoing description that, in the working medium transmission component 40 shown in FIG. 7*a*, the working medium enters from the second connection pipe 422 located inside the first connection pipe and flows out from the first connection pipe 421 located outside the second connection pipe.

EXAMPLE 4

Figure 8:
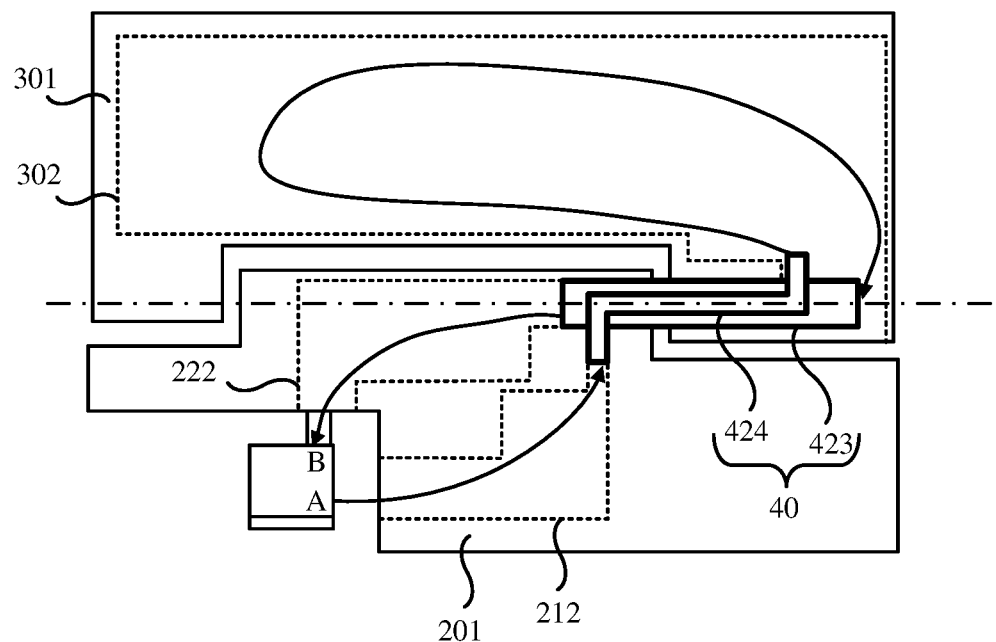
FIG. 8 is a schematic diagram of a structure of another thermal system according to an embodiment of this application.

In this example, as shown in FIG. 8, the primary flow-through structure 202 includes a first primary channel 212 and a second primary channel 222. The working medium transmission component 40 includes a third connection pipe 423 and a fourth connection pipe 424. The fourth connection pipe 424 is nested in an inner hole of the third connection pipe 423. The third connection pipe 423 is rotatably connected to the primary thermal plate 201 and the secondary thermal plate 301.

In some embodiments of this application, the liquid outlet A of the working medium driver 50 communicates with the first primary channel 212, and the liquid inlet B communicates with the second primary channel 222. In addition, an inner hole of the third connection pipe 423 communicates with the second primary channel 222 in the primary thermal plate 201 and the secondary flow-through structure 302 in the secondary thermal plate 301. An inner hole of the fourth connection pipe 424 communicates with the first primary channel 212 and the secondary flow-through structure 302.

To enable the primary thermal plate 201 and the secondary thermal plate 301 to relatively rotate by using the third connection pipe 423, a disposing manner is the same as that of disposing the first connection pipe 421 and the second connection pipe 422 in Example 3: At least a part that is in each of the third connection pipe 423 and the fourth connection pipe 424 and that is located between the primary thermal plate 201 and the secondary thermal plate 301 is made of a flexible material such as a resin material.

In this way, the working medium flows, in an arrow direction shown in FIG. 8, to the secondary flow-through structure 302 in the secondary thermal plate 301 through the fourth connection pipe 424 after passing through the first primary channel 212. Then, the working medium in the secondary flow-through structure 302 may flow to the second primary channel 222 of the primary thermal plate 201 through the third connection pipe 423 in the arrow direction shown in FIG. 8, and then flow back to the liquid inlet B of the working medium driver 50 through the second primary channel 222. Therefore, after being driven by the working medium driver 50, the working medium can perform a next heat dissipation process again. In this case, in the working medium transmission component 40 shown in FIG. 8, the working medium enters from the fourth connection pipe 424 located inside and flows out from the third connection pipe 423 located outside.

Alternatively, in some other embodiments of this application, the liquid inlet B of the working medium driver 50 may communicate with the first primary channel 212, and the liquid outlet A may communicate with the second primary channel 222. In this case, a flow-through manner of the working medium in the thermal system 02 may be the same as that described above, and details are not described herein again.

For any one of the examples described above, the following describes the primary flow-through structure 202 and a structure of the primary thermal plate 201 in the first-level thermal component 20. In some embodiments of this application, the first-level thermal component 20 may be a vapor chamber. In this case, the primary flow-through structure 202 in the first-level thermal component 20 may be a capillary structure in the vapor chamber. Alternatively, the first-level thermal component 20 may be a cold plate. No capillary structure needs to be disposed in the cold plate, so that a structure of the first-level thermal component 20 is simpler.

Alternatively, in some other embodiments of this application, the primary thermal plate 201 may be a metal block, and the primary flow-through structure 202 may be a pipe disposed in the metal block and extending through the metal block. For example, the pipe may be a heat pipe having a capillary structure.

Figure 9:
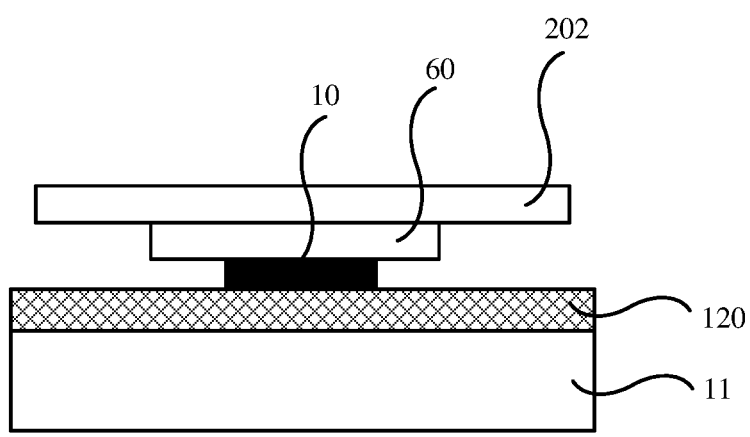
FIG. 9 is a sectional view of a partial structure of a thermal system according to an embodiment of this application.

It can be learned from the foregoing description that the primary thermal plate 201 is configured to be in contact with the heat emitting element 10 (as shown in FIG. 1) on the main board 120, to dissipate heat for the heat emitting element 10. In some embodiments of this application, to further improve a heat dissipation effect of the thermal system 02 on the heat emitting element 10, as shown in FIG. 9 (a sectional view obtained by performing section on the electronic device 01 along a surface perpendicular to the first housing 11), the thermal system 02 further includes an auxiliary thermal component 60. The auxiliary thermal component 60 may be a thermal fin made of a metal material or a thermoelectric cooling film.

The auxiliary thermal component 60 is located between the heat emitting element 10 and the primary thermal plate 201, and the auxiliary thermal component 60 is in contact with the heat emitting element 10 and the primary thermal plate 201. When the auxiliary thermal component 60 is the thermoelectric cooling film, if the thermoelectric cooling film is energized, a surface of a side with low temperature may be in contact with the heat emitting element 10, thereby facilitating heat dissipation of the heat emitting element 10.

The following describes a structure of the second-level thermal component 30 including the secondary flow-through structure 302 and the secondary thermal plate 301. As described above, in some embodiments of this application, the second-level thermal component 30 may be a vapor chamber. In this case, the secondary flow-through structure 302 may be a capillary structure in the vapor chamber. Alternatively, in some other embodiments of this application, the secondary thermal plate 301 may be a metal block, and the secondary flow-through structure 302 may be a heat pipe disposed in the metal block and extending through the metal block. Alternatively, the second-level thermal component 30 may be a cold plate.

For another example, in some other embodiments of this application, as shown in FIG. boa, the secondary flow-through structure 302 may be a cavity formed in a plate structure of the secondary thermal plate 301. One end of the cavity communicates with a liquid inlet of the secondary thermal plate 301 (a direction in which the working medium enters a secondary channel along an arrow), and the other end communicates with a liquid outlet of the secondary thermal plate 301 (a direction in which the working medium flows out of the secondary channel along the arrow).

For another example, in some other embodiments of this application, the secondary flow-through structure 302 includes at least one secondary channel 3021 extending through a plate structure of the secondary thermal plate 301. For example, as shown in FIG. 10b, two secondary channels 3021 extending through the plate structure of the secondary thermal plate 301 may constitute the secondary flow-through structure 302. Alternatively, as shown in FIG. 10c, three secondary channels 3021 extending through the plate structure of the secondary thermal plate 301 may constitute the secondary flow-through structure 302.

One end of each secondary channel 3021 communicates with a liquid inlet of the secondary thermal plate 301 (a direction in which the working medium enters the secondary channel along an arrow), and the other end communicates with a liquid outlet of the secondary thermal plate 301 (a direction in which the working medium flows out of the secondary channel along the arrow). Two adjacent secondary channels 3021 are separated by using the plate structure. In this way, the secondary channel 3021 can be used to steer the working medium flowing into the secondary flow-through structure 302, so that the working medium flows along a shape of the secondary channel 3021.

Figure 10A:
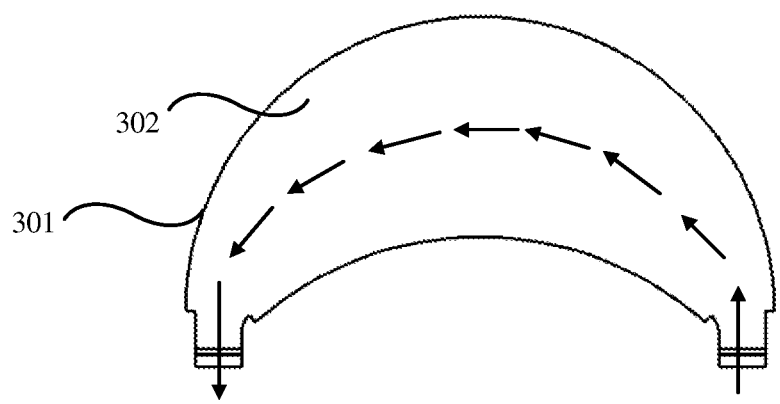
FIG. 10a is a schematic diagram of a structure of a second-level thermal component according to an embodiment of this application.
Figure 10B:
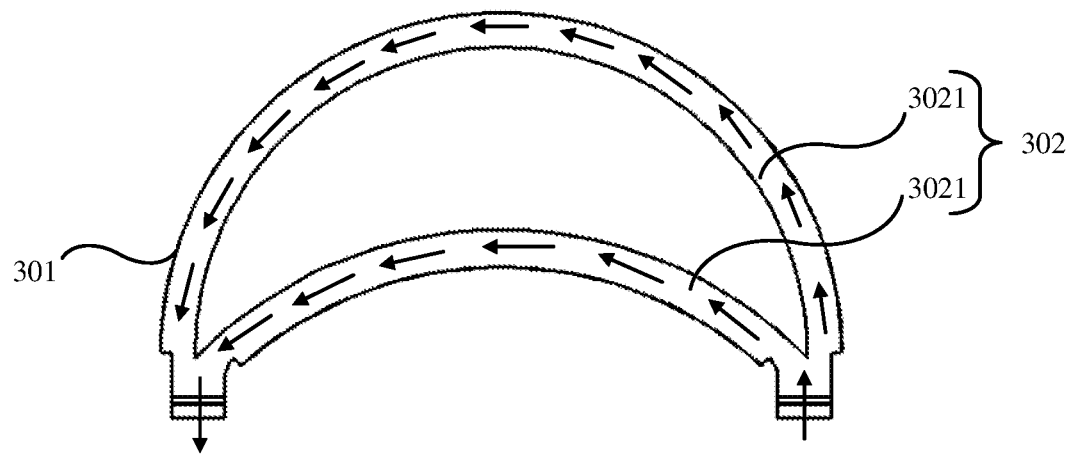
FIG. 10b is a schematic diagram of a structure of another second-level thermal component according to an embodiment of this application.
Figure 10C:
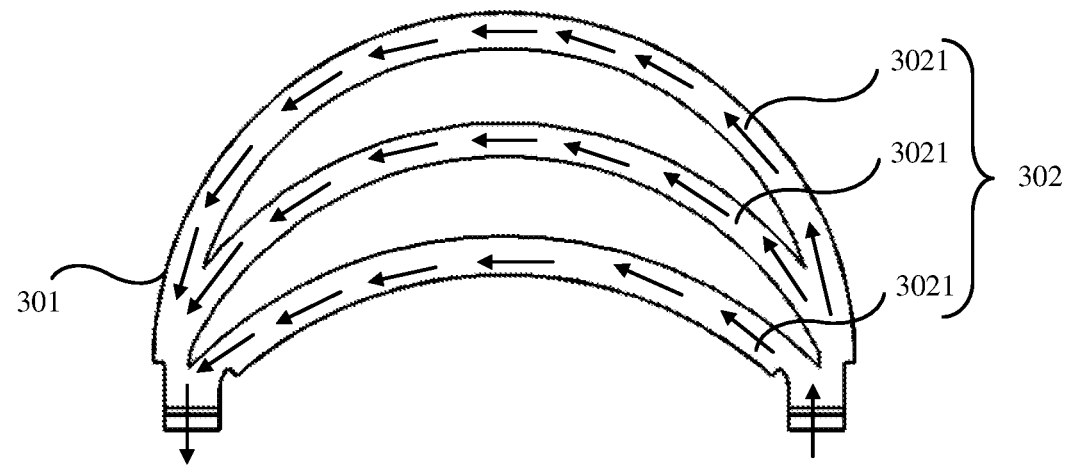
FIG. 10c is a schematic diagram of a structure of another second-level thermal component according to an embodiment of this application.

It should be noted that, an example in which the secondary thermal plate 301 is fan-shaped is used for description in FIG. 10a, FIG. 10b, and FIG. 10c. A shape of the secondary thermal plate 301 is not limited in this embodiment of this application, and the secondary thermal plate 301 may be in a shape of a circle, a rectangle, or the like.

On this basis, one secondary channel 3021 in the secondary flow-through structure 302 is used as an example. In some embodiments of this application, as shown in FIG. na, a shape of the secondary channel 3021 may be in a shape of a square wave. After passing through the first-level thermal component from the liquid outlet A of the working medium driver 50 and dissipating heat for the heat emitting element 10, the working medium flows to the secondary channel 3021 in the square-wave-shaped in the second-level thermal component, and then flows back to the liquid inlet B of the working medium driver 50.

Alternatively, in some other embodiments of this application, as shown in FIG. bib, the secondary channel 3021 may be spiral and does not intersect at any location. After passing through the first-level thermal component from the liquid outlet A of the working medium driver 50 and dissipating heat for the heat emitting element 10, the working medium flows to the spiral secondary channel 3021 in the second-level thermal component, and then flows back to the liquid inlet B of the working medium driver 50.

Figure 11A:
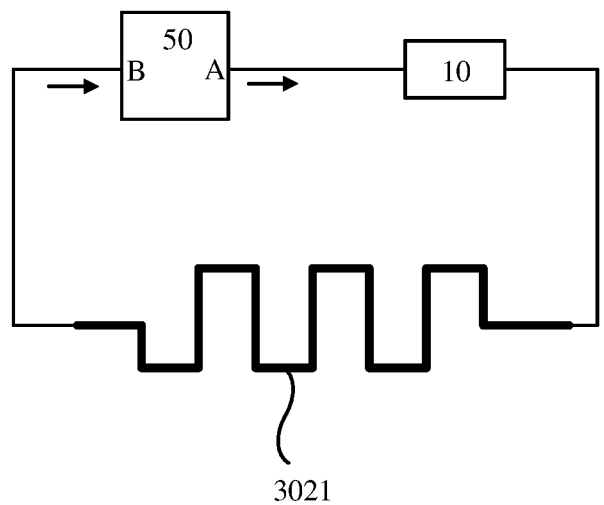
Figure 11B:
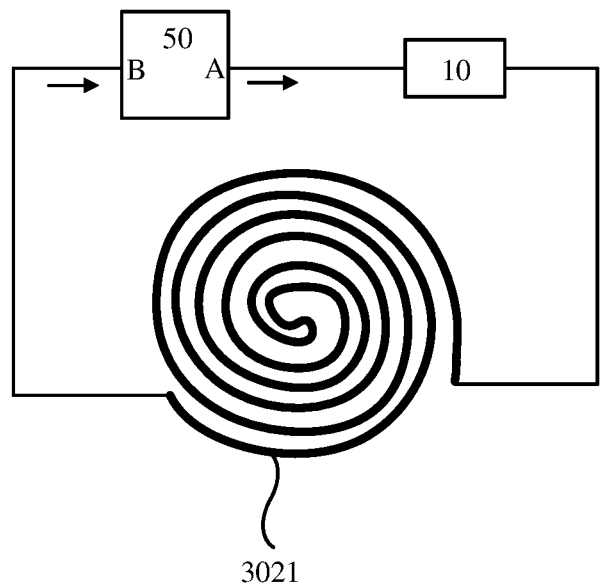

Compared with the solution in FIG. na, in the solution in FIG. 11b, a side wall of the secondary channel 3021 is curved, so that resistance of the side wall of the secondary channel 3021 to the working medium can be effectively reduced in a process in which the working medium flows in the secondary channel 3021. Therefore, the working medium can flow more smoothly in the secondary channel 3021, and power consumption of the working medium driver 50 is reduced. Similarly, the secondary channel 3021 may be alternatively in an S shape with rounded corners.

Figure 12A:
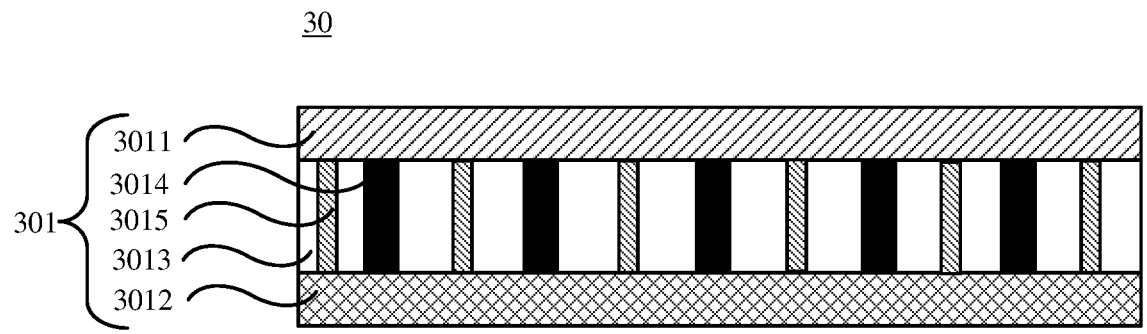
FIG. 12a is a schematic diagram of a structure of a cross section of a second-level thermal component according to an embodiment of this application.

For another example, in some other embodiments of this application, the secondary thermal plate 301 of the second-level thermal component 30 includes a second upper cover 3011 and a second lower bottom 3012 that are shown in FIG. 12a (a cross sectional view of the secondary thermal plate 301). The second upper cover 3011 is connected to the second lower bottom 3012 to form a cavity 3013.

Figure 12B:
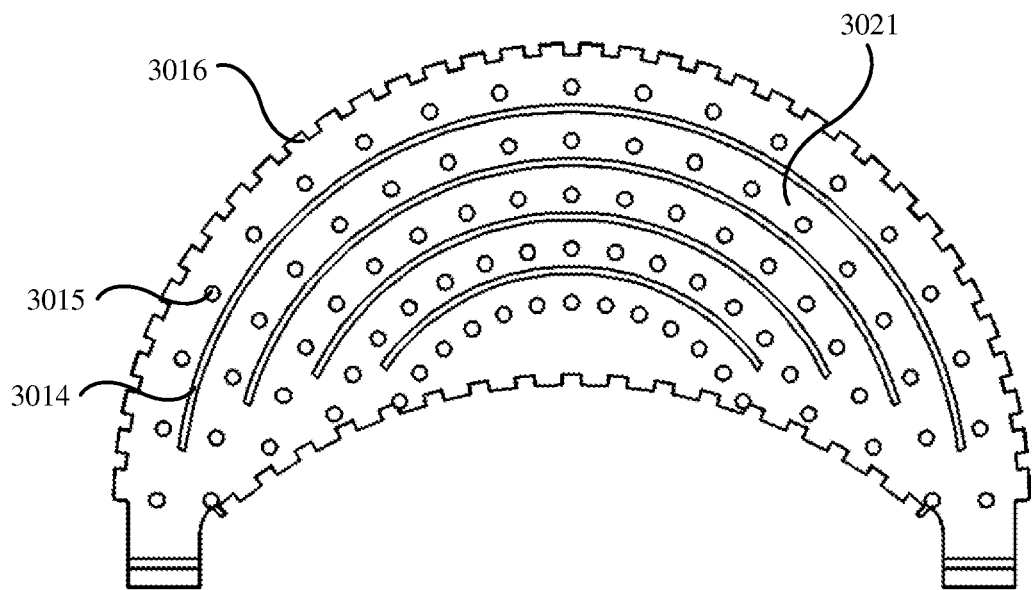
FIG. 12b is a schematic diagram of a structure of another second-level thermal component according to an embodiment of this application.

In addition, the secondary thermal plate 301 further includes a plurality of support bars 3014 that are located in the cavity 3013 and that are disposed at intervals. The support bar 3014 is connected to the second upper cover 3011 and the second lower bottom 3012. A secondary channel 3021 shown in FIG. 12b is formed between two adjacent support bars 3014. A plurality of secondary channels 3021 form the secondary flow-through structure 302 in the second-level thermal component 30. In this way, the secondary channels 3021 formed by using the plurality of support bars 3014 that are disposed at intervals can be used to steer the working medium flowing into the secondary flow-through structure 302, so that the working medium flows along a shape of the secondary channel 3021.

It should be noted that, a shape of each secondary channel 3021 is the same as that described above, and may be in the shape shown in FIG. 11a or FIG. 11b, or may be in an S shape with rounded corners. Details are not described herein one by one.

In addition, to prevent cracking from occurring between the support bars 3014 and both the second upper cover 3011 and the second lower bottom 3012 due to thermal expansion of the secondary thermal plate 301 when the working medium that carries heat passes through the secondary flow-through structure 302, as shown in FIG. 12b, the secondary thermal plate 301 further includes a plurality of support pillars 3015 located in the cavity 3013. As shown in FIG. 12a, each support pillar 3015 is connected to the second upper cover 3011 and the second lower bottom 3012. Therefore, a probability that cracking occurs between the support bars 3014 and both the second upper cover 3011 and the second lower bottom 3012 due to thermal expansion of the secondary thermal plate 301 can be reduced.

In addition, to precisely mount the secondary thermal plate 301 of the second-level thermal component 30 on the second housing 12, a plurality of protrusions 3016 that are shown in FIG. 12b and that are disposed at intervals are further provided at an edge of the secondary thermal plate 301. The protrusion 3016 is matched with a positioning component such as a groove on the second housing 12, to implement positioning and mounting of the secondary thermal plate 301.

The following describes a structure of the working medium driver 50. It can be learned from the foregoing description that the working medium driver 50 may drive the working medium to circulate in the closed loop including the working medium driver 50, the primary flow-through structure 202, and the secondary flow-through structure 302. On this basis, in this embodiment of this application, the working medium driver 50 may be a micro pump body, a micro magnetic liquid thruster, or a micro propeller thruster. When the working medium driver 50 is the micro magnetic liquid thruster, the working medium needs to be conductive.

Figure 13A:
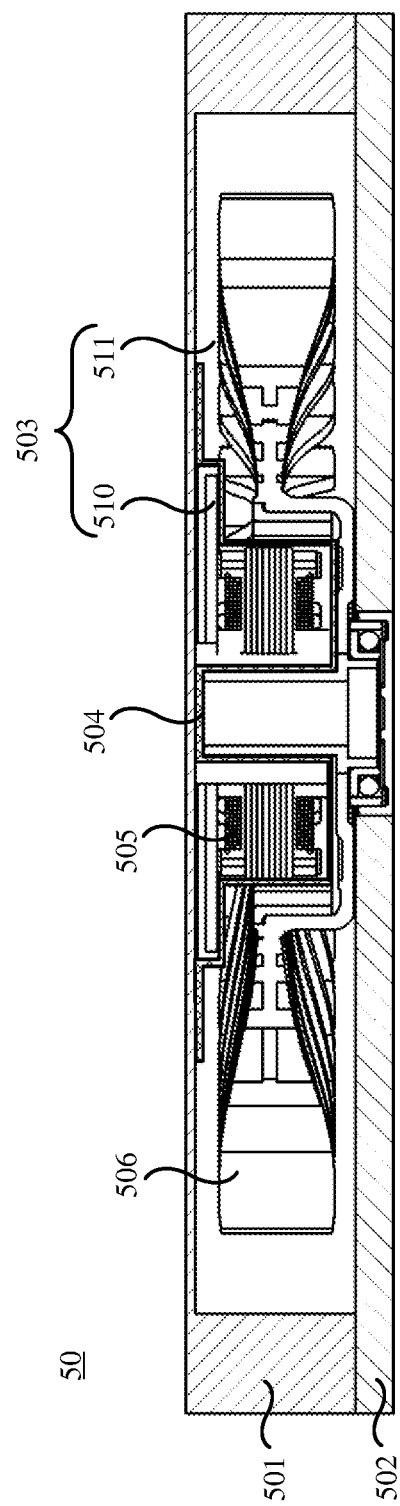
FIG. 13a is a schematic diagram of a structure of a cross section of a working medium driver according to an embodiment of this application.

For any one of the working medium drivers 50, as shown in FIG. 13a (a cross sectional view of the working medium driver), the working medium driver includes a first upper cover 501 and a first lower bottom 502. The first upper cover 501 is connected to the first lower bottom 502 to form an accommodation cavity 503. In addition, the working medium driver 50 further includes a partition plate 504, a stator 505, and a rotor 506.

As shown in FIG. 13a, the partition plate 504 is connected to the first lower bottom 502. A sealing sub-cavity 510 is formed between the partition plate 504 and the first lower bottom 502, and the stator 505 is located in the sealing sub-cavity 510. In addition, a liquid sub-cavity 511 is formed between the partition plate 504 and the first upper cover 501. The rotor 506 is located in the liquid sub-cavity 511. To enable the working medium to flow into the liquid sub-cavity 511, the liquid outlet and the liquid inlet of the working medium driver 50 are provided on the liquid sub-cavity 511.

In this way, the stator 505 can be separated from the working medium in the liquid sub-cavity 511 by using the partition plate 504. When an electrical signal such as a pulse width modulation (pulse width modulation, PWM) signal is provided for the stator 505, a magnetic field is generated around the stator 505. The rotor 506 generates induced electromotive force in the magnetic field, thereby generating a current in a closed-loop rotor line. The current can enable another magnetic field to be generated around the rotor 506. When poles of the two magnetic fields are the same, repulsion occurs, so that the rotor 506 rotates. When the rotor 506 rotates, the working medium in the liquid sub-cavity 511 can be driven to flow in the liquid sub-cavity 511, so that the working medium flows out of the liquid outlet from the liquid inlet of the working medium driver 50, to implement circulation of the working medium in the closed loop including the working medium driver 50, the primary flow-through structure 202, and the secondary flow-through structure 302.

In addition, when the PWM signal is changed, polarities of the magnetic field generated by the stator 505 and the magnetic field generated by the rotor 506 can be changed, so that a rotation direction of the rotor 506 is changed, and the rotor 506 can rotate forward or backward as required. Therefore, a flow direction of the working medium is changed, and positions of the liquid inlet and the liquid outlet of the working medium accelerator 50 are exchanged.

Figure 13B:
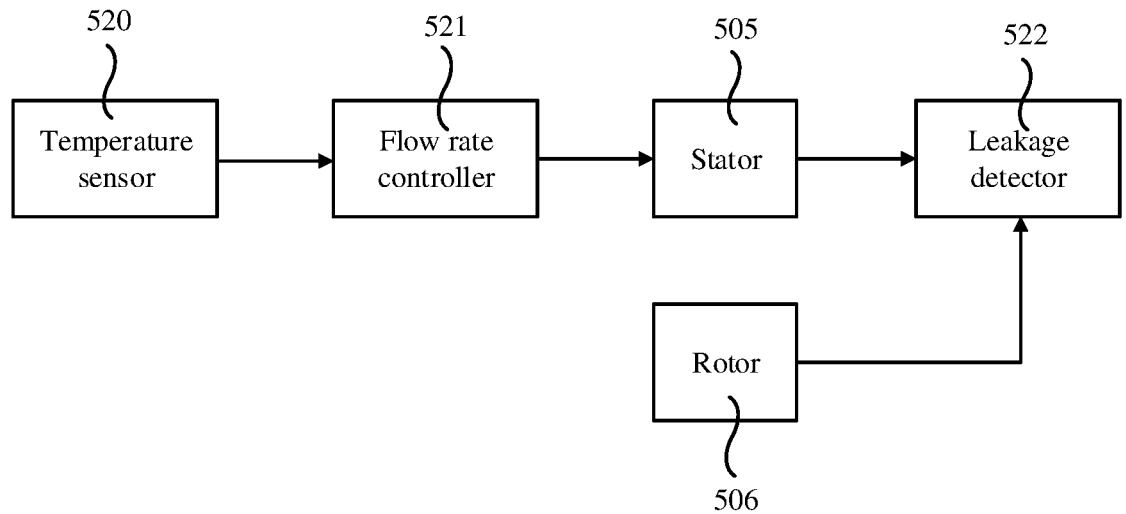
FIG. 13b is a schematic diagram of a structure of a working medium driver according to an embodiment of this application.

In some embodiments of this application, the working medium driver 50 may further include a temperature sensor 520, a flow rate controller 521 and a leakage detector 522 that are shown in FIG. 13b.

The temperature sensor 520 may be located in the liquid sub-cavity 511. The temperature sensor 520 may be configured to detect temperature of the working medium in the liquid sub-cavity 511. In addition, the flow rate controller 521 is electrically connected to the temperature sensor 520 and the stator 505. The flow rate controller 521 may be configured to control, based on a detection result of the temperature sensor 520, a voltage applied to the stator 505, to be specific, control the PWM signal. The temperature detected by the temperature sensor 520 may be directly proportional to the voltage applied to the stator 505. In this way, when the temperature of the working medium in the liquid sub-cavity 511 is high, the voltage applied to the stator 505 can be increased by using the flow rate controller 521, thereby increasing a rotational speed of the rotor 506, increasing a flow rate of the working medium, and improving efficiency of cooling down the heat emitting element 10. On the contrary, when the temperature of the working medium in the liquid sub-cavity 511 is low, the flow rate of the working medium can be reduced.

In addition, as shown in FIG. 13b, the leakage detector 522 may be electrically connected to the stator 505 and the rotor 506, and the leakage detector 522 is configured to: detect the voltage applied to the stator 505 and a rotational speed of the rotor 506, and determine a volume of the working medium in the liquid sub-cavity 511 based on the rotational speed of the rotor 506. Typically, each voltage applied to the stator 505 corresponds to a preset rotational speed of the rotor 506. In this way, an actual rotational speed of the rotor 506 is detected by using the leakage detector 522, and the actual rotational speed is compared with the preset rotational speed. When the actual rotational speed is greater than the preset rotational speed, it may indicate that load of the rotor 506 is reduced and therefore liquid leakage occurs in the liquid sub-cavity 511.

Figure 14A:
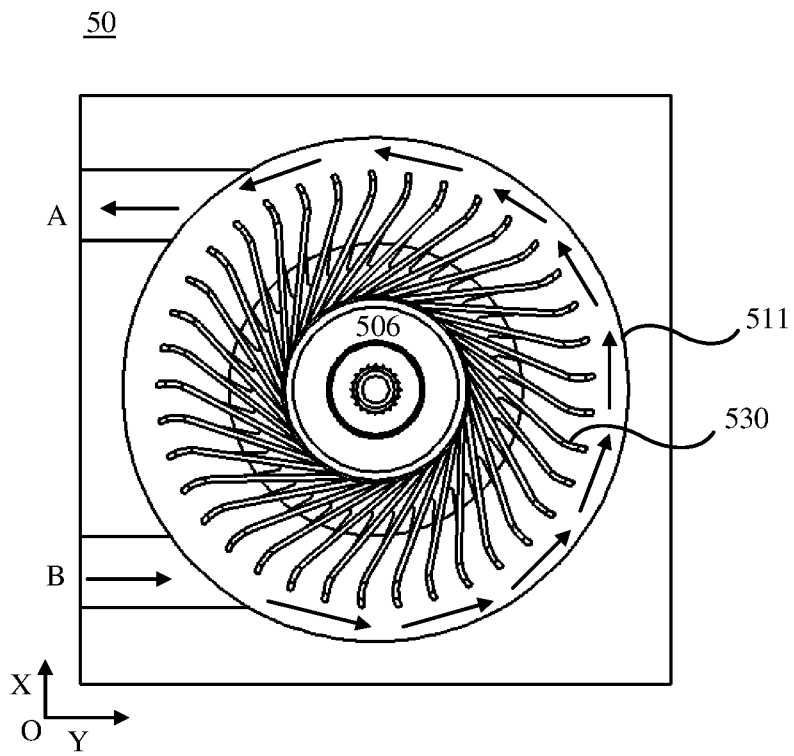
FIG. 14a is a schematic diagram of a structure of a rotor according to an embodiment of this application.

On this basis, to drive the working medium to flow, as shown in FIG. 14a, the working medium driver 50 further includes a plurality of blades 530 that are disposed at intervals and that are connected to the rotor 506. The plurality of blades 530 that are disposed at intervals are disposed around an outer surface of the rotor 506. In this way, when the rotor 506 rotates, the blades 530 may be driven to rotate together, so that the blades 530 can push the working medium in the liquid sub-cavity 511 to flow in the rotation process.

In addition, it can be learned from the foregoing description that, to enable the working medium to be driven by the working medium driver 50 to circulate in the closed loop including the working medium driver 50, the primary flow-through structure 202, and the secondary flow-through structure 302, the working medium driver 50 has the liquid inlet B and the liquid outlet A that are shown in FIG. 14a and that are provided on the liquid sub-cavity 511. An included angle between the liquid inlet B and the liquid outlet A may be 0° to 180°.

Figure 14B:
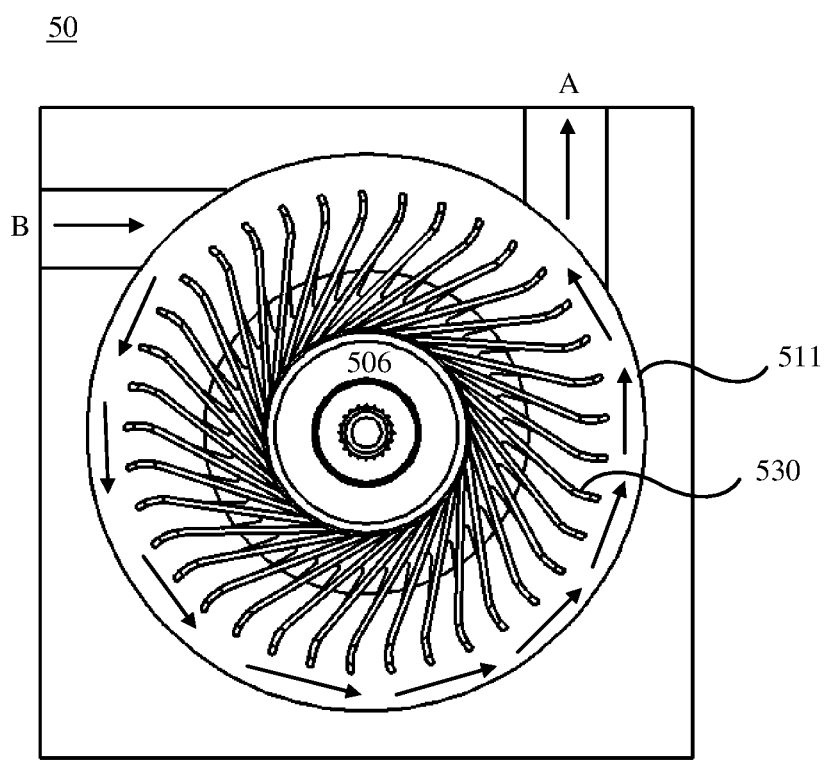
FIG. 14b is a schematic diagram of a structure of another rotor according to an embodiment of this application.
Figure 14C:
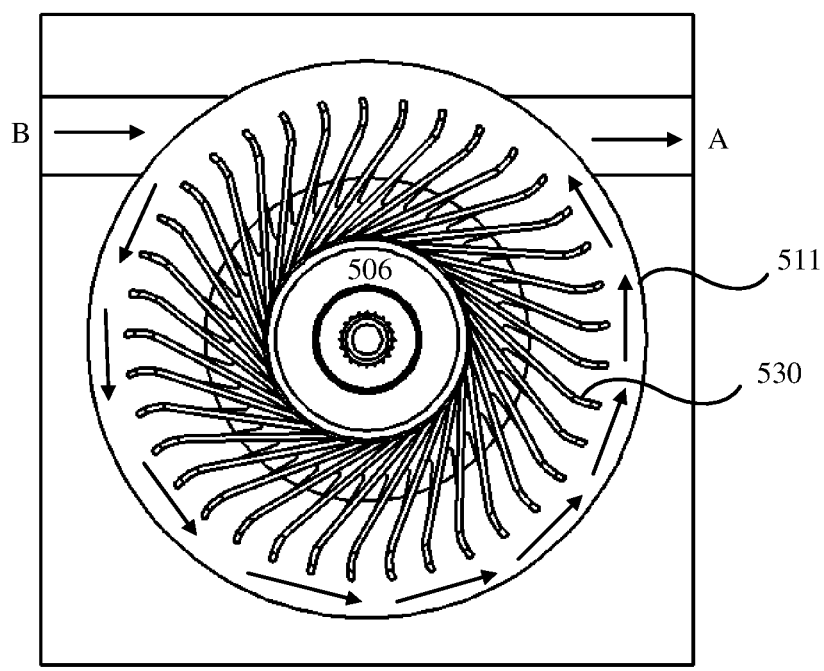
FIG. 14c is a schematic structural diagram of another rotor according to an embodiment of this application.

For example, in some embodiments of this application, as shown in FIG. 14a, the liquid inlet B and the liquid outlet A of the working medium driver 50 are disposed in parallel. In this case, the included angle between the liquid inlet B and the liquid outlet A is 0°. Alternatively, as shown in FIG. 14b, the liquid inlet B and the liquid outlet A of the working medium driver 50 are vertically disposed. In this case, the included angle between the liquid inlet B and the liquid outlet A is 90°. Alternatively, as shown in FIG. 14c, the liquid inlet B of the working medium driver 50 is flush with the liquid outlet A. In this case, the included angle between the liquid inlet B and the liquid outlet A is 180°. For any one of the working medium drivers 50, the working medium can enter an edge of the blade 530 in the working medium driver 50 from the liquid inlet B, and then the working medium is driven by the blade 530 to be thrown out of the liquid outlet A from the edge of the blade 530 in an acceleration manner, thereby completing driving of the working medium.

In some embodiments of this application, parameters of the working medium driver 50 may be shown in Table 1.

It should be noted that, in Table 1, the XOY plane is a surface parallel to a bearing surface that is of the second housing 12 and that is used to bear the working medium driver 50. The thickness of the working medium driver 50 is a dimension that is of the working medium driver 50 and that is in an upward direction perpendicular to the XOY surface. Because the thickness of the working medium driver 50 may be less than or equal to 5 mm, space occupied by the working medium driver 50 in the electronic device 01 can be effectively reduced, thereby facilitating ultra-thin design of the electronic device 01. Therefore, a thickness of the electronic device 01 may be about 13 mm.

In addition, it can be learned from Table 1 that the noise of the working medium driver 50 is less than or equal to 25 dB. Therefore, when the entire thermal system 02 is designed without a fan, noise during normal working is less than 25 dB.

On this basis, a test is performed on the electronic device 01 in a dual burn-in scenario, to be specific, a stress (stress) test and a graphic card test (furmark) are performed on the electronic device 01. A test result is shown in Table 2.

TABLE 2

| Test item | Fan-only solution | Liquid cooling solution in this application |
|---|---|---|
| Power consumption of a heat emitting element (unit: W) | 5 | 12 |
| Overall power consumption of an electronic device (unit: W) | 16 | 25 |
| Power consumption of a working medium driver (unit: W) | / | 1.3 |

TABLE 1

| | | |
|---|---|---|
| Dimension | Thickness | ≤5 mm |
| | Dimension in an XOY plane | ≤50 mm |
| Performance | Flow rate/delivery head | ≥100 ml/min @ 10 Kpa @ |
| | Noise | ≥25 dB @ 0.3 m away |
| | Power consumption | ≤1.5 W |
| | Working voltage | 5 V |
| | Working temperature of a working medium | −20° C. to 85° C. |
| | Speed adjustment requirement | A rotational speed maybe adjusted by providing a PWM signal to a stator, a speed adjustment range is 30% to 100% of a rated rotational speed, and noise at a minimum rotational speed is less than or equal to 25 dB |
| | Requirements for a working medium | ① Flame retardance: at least meeting an HB flame spread rating (a lowest rating in a flame retardance rating UL94); ② Corrosion: no corrosion to metal such as copper, aluminum, and iron; ③ Environment requirements: meeting standards such as RoHS; ④ Electrical insulation: resistance >$10^8$ Ω |
| Reliability | Life | ≥50000 Hrs (unit: hour) (at 40° C. and a rated rotational speed) |
| | Reliability test | After reliability tests such as an accelerated life test, a mechanical vibration test, a mechanical shock test, a temperature cycle test, and a pressure bearing test, noise change at a rated working point is less than or equal to 3 dB; voltage, current, and rotational speed changes are less than or equal to 10%; and flow rate and delivery head changes are less than or equal to 10% |

TABLE 2-continued

| Test item | Fan-only solution | Liquid cooling solution in this application |
|---|---|---|
| Junction temperature (junction temperature, Tj) of a CPU (unit: ° C.) | 55 | 62 |
| Temperature of a keyboard surface of a keyboard on a second housing (unit: ° C.) | 42 | 42 |
| Temperature of a back surface of a first housing (unit: ° C.) | / | 44 |
| Ambient temperature around the electronic device (unit: ° C.) | 25 | 25 |

It can be learned from Table 2 that, compared with the solution in which only a fan is used to dissipate heat for the heat emitting element 10, after the thermal system 02 provided in this embodiment of this application is used in the electronic device 01 to dissipate heat for the heat emitting element 10, the power consumption of the heat emitting element 10 may be increased from 5 W to 12 W, the power consumption of the electronic device 01 may be increased from 16 W to 25 W, and the temperature of the CPU is 62° C. that is less than 80° C.

In addition, after the thermal system 02 provided in this embodiment of this application dissipates heat for the heat emitting element 10, the temperature of the keyboard surface of the electronic device 01, the temperature of the back surface of the first housing 11, and the entire temperature of the electronic device 01 may be equivalent to those in the solution in which only a fan is used to dissipate heat for the heat emitting element 10. Therefore, when the thermal system 02 provided in this embodiment of this application is used in the electronic device 01, the overall power consumption of the heat emitting element 10 and the electronic device 01 can be improved while a heat dissipation effect is ensured, thereby facilitating development of the electronic device 01 in a multifunction and high-speed direction.

Figure 15:
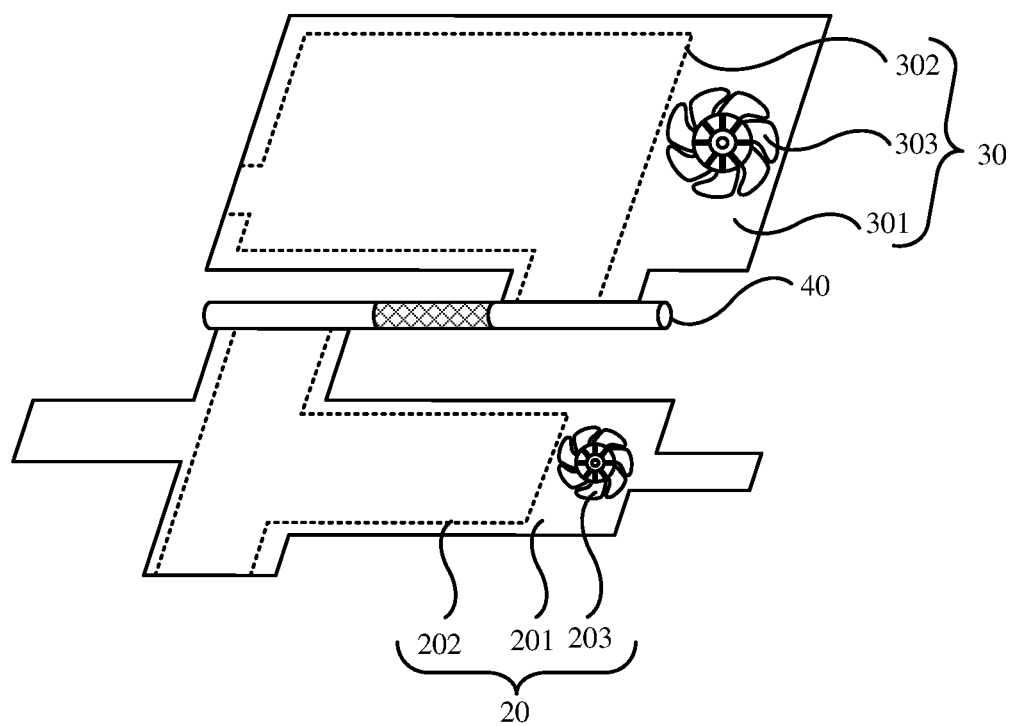
FIG. 15 is a schematic diagram of a structure of another thermal system according to an embodiment of this application.

On this basis, to further improve the heat dissipation effect of the thermal system 02 on the heat emitting element 10, the first-level thermal component 20 further includes a primary fan 203 shown in FIG. 15. The primary fan 203 is connected to the primary thermal plate 201. In a rotation process of the primary fan 203, heat of the primary thermal plate 201 that absorbs heat of the heat emitting element 10 can be dissipated, to improve a heat dissipation effect of the primary thermal plate 201 on the working medium.

Similarly, the second-level thermal component further includes a secondary fan 303 shown in FIG. 15. The secondary fan 303 is connected to the secondary thermal plate 301. In a rotation process of the secondary fan 303, heat of the secondary thermal plate 301 can be dissipated, to improve a heat dissipation effect of the secondary thermal plate 301 on the working medium.

In some embodiments of this application, the primary fan 203 and the secondary fan 303 include but are not limited to a centrifugal fan, an axial fan, an air suction turbine, and the like.

Figure 16A:
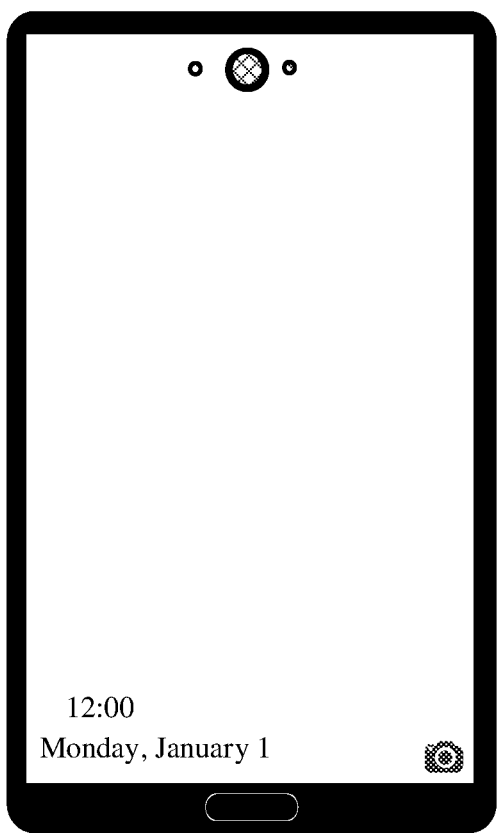
FIG. 16a is a schematic diagram of a structure of another electronic device according to some embodiments of this application.

An example in which the electronic device 01 is a notebook computer shown in FIG. 1 is used for description above. In some other embodiments of this application, the electronic device 01 may be a tablet computer or a mobile phone shown in FIG. 16a. For ease of description, the following is described by using an example in which the electronic device 01 is the mobile phone shown in FIG. 1.

Figure 16B:
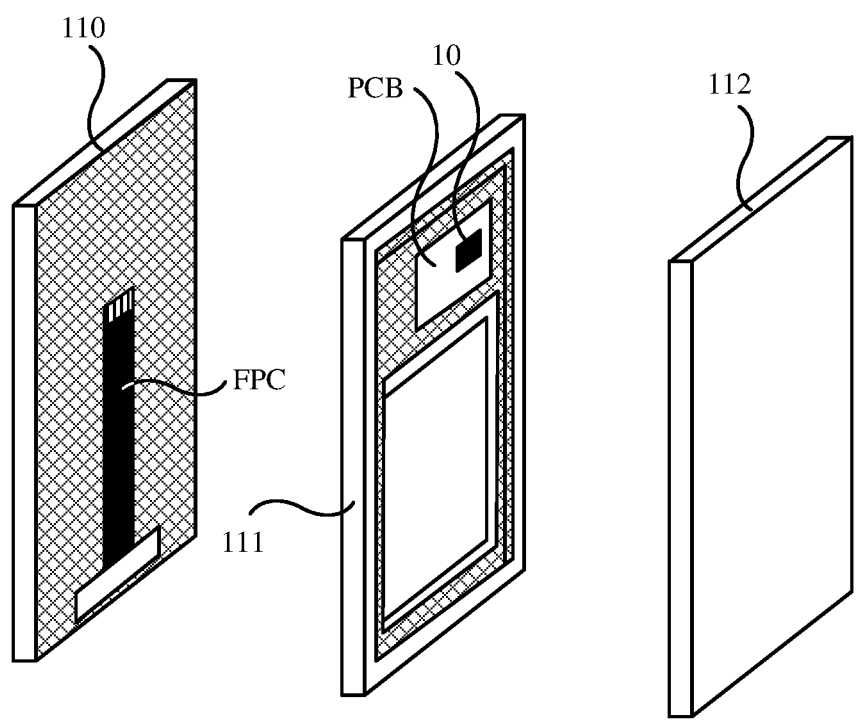

In this case, as shown in FIG. 16b, the electronic device 01 mainly includes a display module 110, a middle frame 111, and a rear housing 112. The middle frame 111 is located between the display module no and the rear housing 112. The display module no is connected to the rear housing 112 by using the middle frame 111.

A drive circuit in the display module no may be electrically connected to a main board such as a printed circuit board (printed circuit board, PCB) on the middle frame 111 after passing through the middle frame 111 by using a flexible printed circuit (flexible printed circuit, FPC). Therefore, the display module no may be controlled by using a chip on the PCB, to be specific, a heat emitting element 10 such as an SOC to display an image.

Figure 17A:
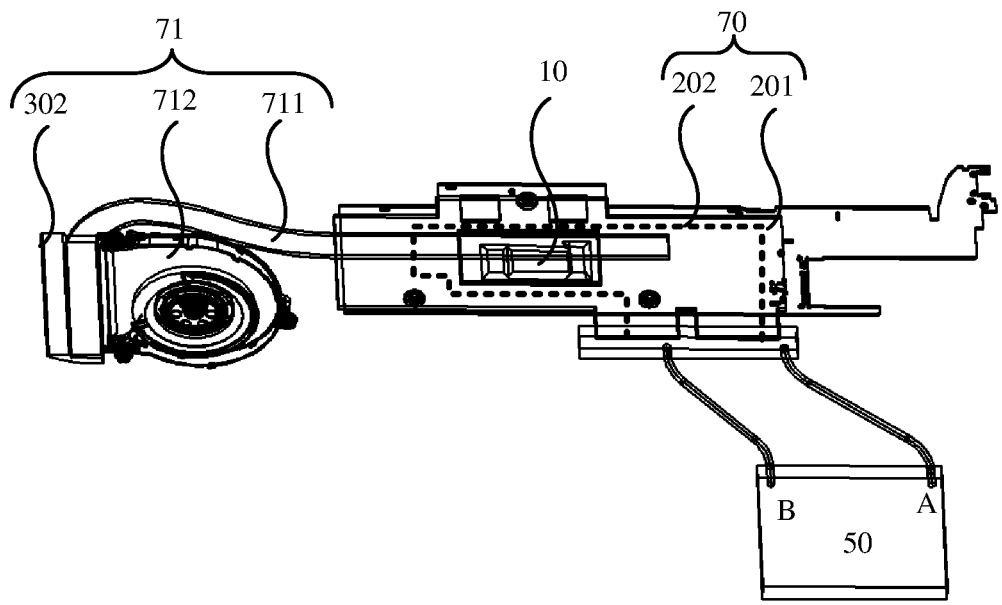
FIG. 17a is a schematic diagram of a structure of a thermal system according to an embodiment of this application.

In this case, to dissipate heat for the heat emitting element 10 in the electronic device 01, the electronic device 01 further includes a thermal system 02 shown in FIG. 17a. The thermal system 02 includes a first thermal component 70, a second thermal component 71, and a working medium driver 50.

Figure 17B:
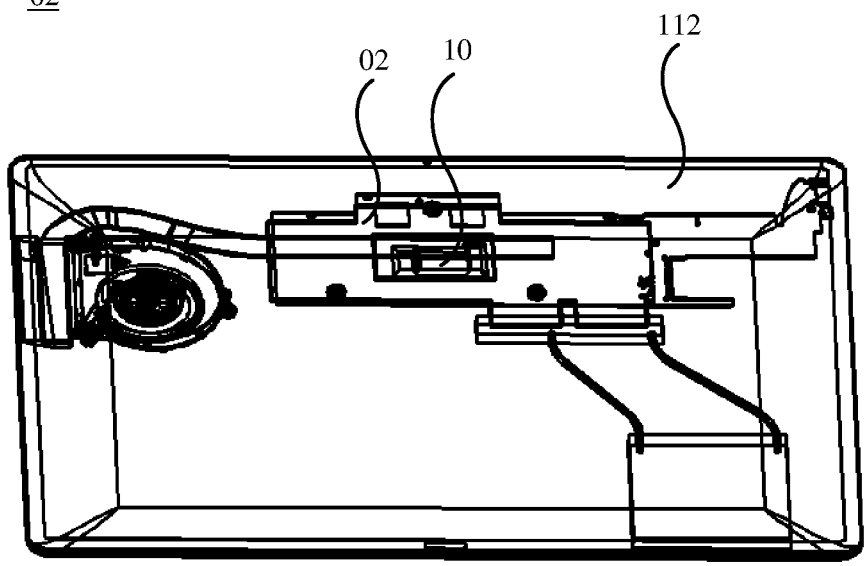

The first thermal component 70 includes a primary thermal plate 201 and a primary flow-through structure 202 disposed in the primary thermal plate 201. A manner of disposing the primary thermal plate 201 and the primary flow-through structure 202 is the same as that described above, and details are not described herein again. In this case, the thermal system 02 may be disposed between the middle frame 111 and the rear housing 112. In addition, after the middle frame 111 is connected to the rear housing 112, the thermal system 02 shown in FIG. 17b, is located in the rear housing 112. In this way, one side of the primary thermal plate 201 may be in contact with the heat emitting element 10, and the other side may be in contact with the rear housing 112.

In addition, a liquid outlet A and a liquid inlet B of the working medium driver 50 communicate with the primary flow-through structure 202 in the primary thermal plate 201. The thermal system 02 further includes a first working medium (not shown in the figure) located in the working medium driver 50 and the primary flow-through structure 202. The working medium driver 50 is configured to drive the first working medium to circulate in a closed loop including the working medium driver 50 and the primary flow-through structure 202. A structure of the working medium driver 50 is the same as that described above, and details are not described herein again.

Figure 17C:
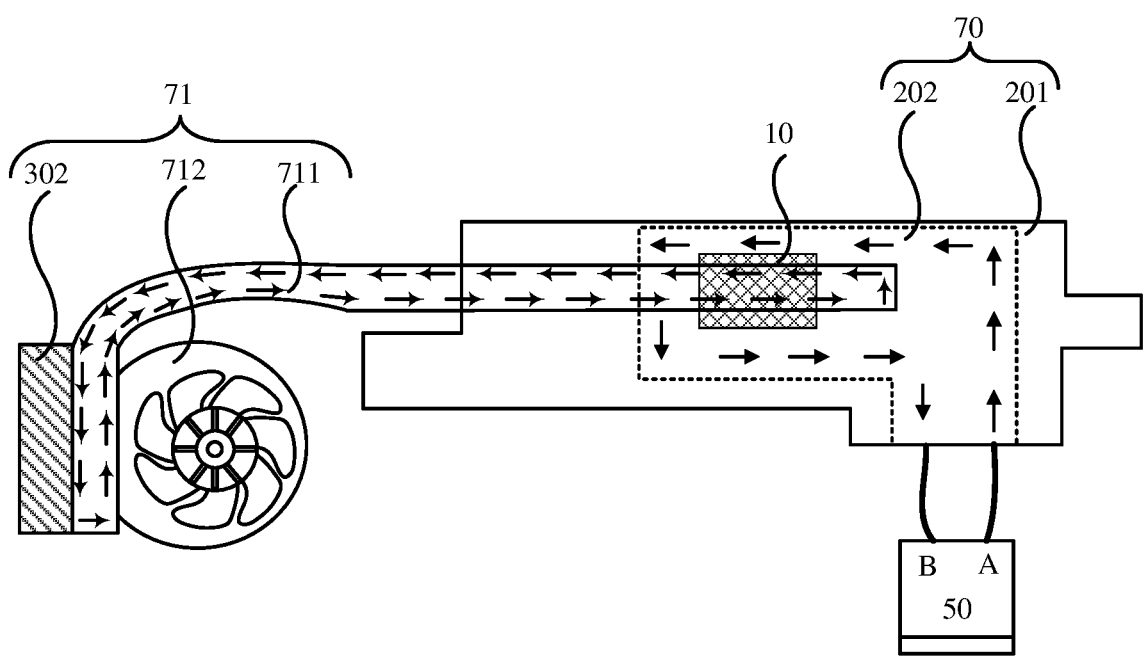

In this way, as shown in FIG. 17c, the working medium driver 50 may drive the first working medium to flow from the liquid outlet A of the working medium driver 50 to the primary flow-through structure 202 in the primary thermal plate 201 in an arrow direction. Because the primary thermal plate 201 is in contact with the heat emitting element 10, heat of the heat emitting element 10 is absorbed by using the first working medium. The first working medium that absorbs the heat flows back to the liquid inlet B of the working medium driver 50, so that the first working medium performs cyclic heat dissipation on the heat emitting element 10.

In addition, because the primary thermal plate 201 is further in contact with the rear housing 112, in a process in which the first working medium flows in the primary flow-through structure 202, heat may be dissipated to the rear housing 112 by using the primary thermal plate 201, and the rear housing 112 releases the heat into the environment.

On this basis, as described above, the thermal system 02 further includes an auxiliary thermal component located between the heat emitting element 10 and the primary thermal plate 201. The auxiliary thermal component and the heat emitting element 10 are in contact with the primary thermal plate 201. In some embodiments of this application, the auxiliary thermal component may be a thermal fin or a thermoelectric cooling film. A beneficial effect of the auxiliary thermal component is the same as that described above, and details are not described herein again.

As shown in FIG. 17a, the second thermal component 71 includes a secondary thermal pipe 711, a fan 712, and a secondary thermal plate 301. One end of the secondary thermal pipe 711 is in contact with the heat emitting element 10, and the other end is located between an air outlet of the fan 712 and the secondary thermal plate 301, and is connected to the fan 712 and the secondary thermal plate 301.

In some embodiments of this application, the secondary thermal plate 301 may be a thermal fin, a vapor chamber, or a thermoelectric cooling film. The secondary thermal pipe 711 may be a heat pipe. On this basis, the thermal system 02 further includes a second working medium (not shown in the figure) located in the secondary thermal pipe 711.

In this way, because one end of the secondary thermal pipe 711 is in contact with the heat emitting element 10, heat of the heat emitting element 10 may enable the second working medium in the secondary thermal pipe 711 to vaporize and flow, in an arrow direction shown in FIG. 17c, to the other end that is of the secondary thermal pipe 711 and that has relatively low temperature. Because the other end of the secondary thermal pipe 711 is located between the air outlet of the fan 712 and the secondary thermal plate 301, and is connected to the fan 712 and the secondary thermal plate 301, heat of the second working medium in the secondary thermal pipe 711 may be taken away by using the air outlet of the fan 712 and the secondary thermal plate 301. In this way, after temperature of the second working medium is reduced, the second working medium condenses into a liquid state, and flows, in a direction shown by an arrow, back to the end that is of the secondary thermal pipe 711 and that is in contact with the heat emitting element 10. Therefore, the second working medium can perform cyclic heat dissipation on the heat emitting element 10.

In addition, the fan 712 includes but is not limited to a centrifugal fan, an axial fan, an air suction turbine, and the like.

It can be learned from the foregoing description that, when the electronic device 01 is a mobile phone or a tablet computer, the thermal system 02 provided in the embodiments of this application includes two independent thermal paths. In a first thermal path, the first working medium circulates in the working medium driver 50 and the primary flow-through structure 202 in the primary thermal plate 201, to dissipate heat for the heat emitting element 10 that is in contact with the primary thermal plate 201. In a second thermal path, the second working medium circulates in the secondary thermal pipe 711, to dissipate heat for the heat emitting element 10 that is in contact with the primary thermal plate 201.

In addition, it can be learned from the foregoing description that, a thickness of the working medium driver 50 may be less than or equal to 5 mm, thereby effectively reducing space occupied by the working medium driver 50 in the electronic device 01. Therefore, a thickness of the mobile phone or the tablet computer having the thermal system 02 may be within 7 mm.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A thermal system, comprising:
a first component, comprising a primary thermal plate and a driver, wherein the primary thermal plate comprises a first transmission channel;
a working medium;
a second component, comprising a secondary thermal plate, wherein the secondary thermal plate comprises a second transmission channel that comprises a secondary channel, wherein the secondary channel comprises a portion having a spiral shape in a plane, the secondary channel does not intersect itself at any location, a straight line that extends in the plane from a center point of the spiral shape to an outer edge of the spiral shape passes through at least two rings of the portion having the spiral shape, and the center point is completely encircled in the plane by the portion having the spiral shape; and
a connector comprising a third transmission channel;
wherein the primary thermal plate is in contact with a heat emitting element;
wherein the connector is rotatably connected to the secondary thermal plate and the first component in a manner that the third transmission channel is configured to transmit the working medium with the first transmission channel and the second transmission channel; and
wherein the driver is configured to drive the working medium to flow through the first transmission channel, the second transmission channel, and the third transmission channel, and a thickness of the driver is less than or equal to 5 mm.

2. The thermal system according to claim 1, wherein the connector comprises a first connector, and the first connector is rotatably connected to the primary thermal plate and the secondary thermal plate in a manner that the third transmission channel is configured to transmit the working medium with the first transmission channel and the second transmission channel; and
wherein the first connector comprises:
a primary connection pipe connected to the primary thermal plate, wherein an inner hole of the primary connection pipe communicates with the first transmission channel; and
a secondary connection pipe rotatably connected to the primary connection pipe, wherein the secondary connection pipe is connected to the secondary thermal plate, and an inner hole of the secondary connection pipe communicates with the second transmission channel.

3. The thermal system according to claim 2, wherein the first connector further comprises a hose; and
wherein the hose passes through the inner hole of the primary connection pipe and the inner hole of the secondary connection pipe, a first end of the hose communicates with the first transmission channel, a second end communicates with the second transmission channel, and an inner hole of the hose serves as the third transmission channel.

4. The thermal system according to claim 2, wherein:
the first connector further comprises a rotary connection pipe and at least one seal;
a first end of the primary connection pipe is butted with a second end of the secondary connection pipe, and the first end of the primary connection pipe and the second end of the secondary connection pipe are both nested in the rotary connection pipe; and the at least one seal is located between a hole wall of an inner hole of the rotary connection pipe and an outer wall of the primary connection pipe, or the at least one seal is located between a hole wall of an inner hole of the rotary connection pipe and an outer wall of the secondary connection pipe.

5. The thermal system according to claim 2, wherein the first connector further comprises at least one seal; and
a part of the primary connection pipe extends into the inner hole of the secondary connection pipe, and the at least one seal is located between an outer wall of the primary connection pipe and a hole wall of the inner hole of the secondary connection pipe; or
a part of the secondary connection pipe extends into the inner hole of the primary connection pipe, and the at least one seal is located between an outer wall of the secondary connection pipe and a hole wall of the inner hole of the primary connection pipe.

6. The thermal system according to claim 2, wherein:
the connector further comprises a second connector, and the second connector is rotatably connected to the secondary thermal plate and the driver; and
a liquid outlet of the driver communicates with the first transmission channel, and a fourth transmission channel in the second connector communicates with the second transmission channel and a liquid inlet of the driver.

7. The thermal system according to claim 1, wherein:
the connector comprises a first connection pipe and a secondary connection pipe, the secondary connection pipe is nested in an inner hole of the first connection pipe, and the first connection pipe is rotatably connected to the primary thermal plate and the secondary thermal plate;
the inner hole of the first connection pipe communicates with a liquid inlet of the driver and the second transmission channel, and a liquid outlet of the driver communicates with the first transmission channel; and
an inner hole of the secondary connection pipe communicates with the first transmission channel and the second transmission channel.

8. The thermal system according to claim 7, wherein at least a part that is in each of the first connection pipe and the second connection pipe and that is located between the primary thermal plate and the secondary thermal plate is made of a flexible material.

9. The thermal system according to claim 1, wherein the driver comprises:
a first upper cover;
a first lower bottom connected to the first upper cover to form an accommodation cavity;
a partition plate located in the accommodation cavity and connected to the first lower bottom, wherein a sealing sub-cavity is formed between the partition plate and the first lower bottom, a liquid sub-cavity is formed between the partition plate and the first upper cover, and a liquid outlet and a liquid inlet of the driver are provided on the liquid sub-cavity;
a stator located in the sealing sub-cavity; and
a rotor located in the liquid sub-cavity, wherein the rotor is configured to rotate under an action of a magnetic field generated by the stator, to drive the working medium in the liquid sub-cavity to flow.

10. The thermal system according to claim 9, wherein the driver further comprises:
a temperature sensor located in the liquid sub-cavity and configured to detect temperature of the working medium in the liquid sub-cavity; and
a flow rate controller electrically connected to the temperature sensor and the stator, wherein the flow rate controller is configured to control, based on a detection result of the temperature sensor, a voltage applied to the stator, and the temperature detected by the temperature sensor is directly proportional to the voltage applied to the stator.

11. The thermal system according to claim 9, wherein the driver further comprises a plurality of blades that are disposed at intervals and that are connected to the rotor, and the plurality of blades are disposed around an outer surface of the rotor.

12. The thermal system according to claim 1, wherein:
the first component further comprises a primary fan, and the primary fan is connected to the primary thermal plate; and
the second component further comprises a secondary fan, and the secondary fan is connected to the secondary thermal plate.

13. The thermal system according to claim 1, wherein the secondary thermal plate is fan-shaped.

14. The thermal system according to claim 1, wherein the spiral shape of the portion of the secondary channel comprises a plurality of 360° winds in the plane.

15. The thermal system according to claim 1, wherein the straight line that is from the center point of the spiral shape to the outer edge of the spiral shape passes through at least five winds of the spiral shape.

16. An electronic device, comprising:
a first housing and a second housing that are rotatably connected;
a display mounted on the first housing; and
a main board mounted on the second housing, wherein a heat emitting element is disposed on the main board; and
a thermal system, comprising:
a first component, comprising a primary thermal plate and a driver, wherein the primary thermal plate comprises a first transmission channel;
a working medium;
a second component, comprising a secondary thermal plate, wherein the secondary thermal plate comprises a second transmission channel that comprises a secondary channel, wherein the secondary channel comprises a portion having a spiral shape in a plane, the secondary channel does not intersect itself at any location, a straight line that extends in the plane from a center point of the spiral shape to an outer edge of the spiral shape passes through at least two rings of the portion having the spiral shape, and the center point is completely encircled in the plane by the portion having the spiral shape; and
a connector comprising a third transmission channel;
wherein the primary thermal plate is in contact with a heat emitting element;
wherein the connector is rotatably connected to the secondary thermal plate and the first component in a manner that the third transmission channel is configured to transmit the working medium with the first transmission channel and the second transmission channel; and wherein the driver is configured to drive the working medium to flow through the first transmission channel, the second transmission channel, and the third transmission channel, and a thickness of the driver is less than or equal to 5 mm;

wherein the first component is disposed on the second housing, and the primary thermal plate is in contact with the heat emitting element; and wherein the second component is disposed on the first housing, and the secondary thermal plate is connected to a back surface of the display and the first housing.

17. The electronic device according to claim 16, wherein a driver in the thermal system is located on the second housing and is placed side by side with the second component.

18. The electronic device according to claim 16, wherein the secondary thermal plate is fan-shaped.

19. The electronic device according to claim 16, wherein the spiral shape of the portion of the secondary channel comprises a plurality of 360° winds.

20. The electronic device according to claim 16, wherein the straight line that is from the center point of the spiral shape to the outer edge of the spiral shape passes through at least five winds of the spiral shape.

* * * * *